United States Patent
Ou et al.

(10) Patent No.: US 10,037,884 B2
(45) Date of Patent: Jul. 31, 2018

(54) SELECTIVE ATOMIC LAYER DEPOSITION FOR GAPFILL USING SACRIFICIAL UNDERLAYER

(71) Applicant: Lam Research Corporation, Fremont, CA (US)

(72) Inventors: Fung Suong Ou, Etterbeek (BE); Purushottam Kumar, Hillsboro, OR (US); Adrien LaVoie, Newberg, OR (US); Ishtak Karim, Portland, OR (US); Jun Qian, Sherwood, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/253,301

(22) Filed: Aug. 31, 2016

(65) Prior Publication Data
US 2018/0061628 A1    Mar. 1, 2018

(51) Int. Cl.
*H01L 21/311*    (2006.01)
*H01L 21/02*    (2006.01)
*H01L 21/3065*    (2006.01)

(52) U.S. Cl.
CPC .... *H01L 21/0228* (2013.01); *H01L 21/02266* (2013.01); *H01L 21/02274* (2013.01); *H01L 21/3065* (2013.01)

(58) Field of Classification Search
CPC .......... H01L 21/0228; H01L 21/02266; H01L 21/3065; H01L 21/02274
See application file for complete search history.

(56) References Cited

U.S. PATENT DOCUMENTS

| | | |
|---|---|---|
| 4,500,563 A | 2/1985 | Ellenberger et al. |
| 5,094,984 A | 3/1992 | Liu et al. |
| 5,223,443 A | 6/1993 | Chinn et al. |
| 5,230,929 A | 7/1993 | Caporiccio et al. |
| 5,318,928 A | 6/1994 | Gegenwart et al. |
| 5,496,608 A | 3/1996 | Matsuda et al. |

(Continued)

FOREIGN PATENT DOCUMENTS

| | | |
|---|---|---|
| CN | 1732288 A | 2/2006 |
| CN | 1926668 A | 3/2007 |

(Continued)

OTHER PUBLICATIONS

U.S. Appl. No. 15/015,952, filed Feb. 4, 2016, entitled "Methods for Depositing Films on Sensitive Substrates".

(Continued)

*Primary Examiner* — Alexander Sofocleous
*Assistant Examiner* — Vicki B Booker
(74) *Attorney, Agent, or Firm* — Weaver Austin Villeneuve & Sampson LLP

(57) ABSTRACT

Methods and apparatuses for depositing films in high aspect ratio features and trenches on substrates using atomic layer deposition and deposition of a sacrificial layer during atomic layer deposition are provided. Sacrificial layers are materials deposited at or near the top of features and trenches prior to exposing the substrate to a deposition precursor such that adsorbed precursor on the sacrificial layer is removed in an etching operation for etching the sacrificial layer prior to exposing the substrate to a second reactant and a plasma to form a film.

20 Claims, 9 Drawing Sheets

(56) References Cited

U.S. PATENT DOCUMENTS

| | | | |
|---|---|---|---|
| 5,593,914 A | 1/1997 | Evans, Jr. et al. |
| 5,670,432 A | 9/1997 | Tsai |
| 5,856,003 A | 1/1999 | Chiu |
| 5,874,368 A | 2/1999 | Laxman et al. |
| 5,932,286 A | 8/1999 | Beinglass et al. |
| 6,069,058 A | 5/2000 | Hong |
| 6,100,202 A | 8/2000 | Lin et al. |
| 6,218,293 B1 | 4/2001 | Kraus et al. |
| 6,270,572 B1 | 8/2001 | Kim et al. |
| 6,346,741 B1 | 2/2002 | Van Buskirk et al. |
| 6,391,803 B1 | 5/2002 | Kim et al. |
| 6,416,822 B1 | 7/2002 | Chiang et al. |
| 6,428,859 B1 | 8/2002 | Chiang et al. |
| 6,468,924 B2 | 10/2002 | Lee et al. |
| 6,482,726 B1 | 11/2002 | Aminpur et al. |
| 6,509,601 B1 | 1/2003 | Lee et al. |
| 6,528,430 B2 | 3/2003 | Kwan et al. |
| 6,551,893 B1 | 4/2003 | Zheng et al. |
| 6,569,501 B2 | 5/2003 | Chiang et al. |
| 6,576,053 B1 | 6/2003 | Kim et al. |
| 6,602,784 B2 | 8/2003 | Sneh |
| 6,632,478 B2 | 10/2003 | Gaillard et al. |
| 6,645,574 B1 | 11/2003 | Lee et al. |
| 6,689,220 B1 | 2/2004 | Nguyen |
| 6,723,595 B2 | 4/2004 | Park |
| 6,730,614 B1 | 5/2004 | Lim et al. |
| 6,743,738 B2 | 6/2004 | Todd |
| 6,756,318 B2 | 6/2004 | Nguyen et al. |
| 6,765,303 B1 | 7/2004 | Krivokapic et al. |
| 6,809,421 B1 | 10/2004 | Hayasaka et al. |
| 6,828,218 B2 | 12/2004 | Kim et al. |
| 6,835,417 B2 | 12/2004 | Saenger et al. |
| 6,861,356 B2 | 3/2005 | Matsuse et al. |
| 6,884,466 B2 | 4/2005 | Kaloyeros et al. |
| 6,930,058 B2 | 8/2005 | Hill et al. |
| 6,930,060 B2 | 8/2005 | Chou et al. |
| 6,943,092 B2 | 9/2005 | Kim et al. |
| 6,962,876 B2 | 11/2005 | Ahn et al. |
| 6,987,240 B2 | 1/2006 | Jennings et al. |
| 7,001,844 B2 | 2/2006 | Chakravarti et al. |
| 7,041,335 B2 | 5/2006 | Chung |
| 7,077,904 B2 | 7/2006 | Cho et al. |
| 7,081,271 B2 | 7/2006 | Chung et al. |
| 7,097,886 B2 * | 8/2006 | Moghadam ............ C23C 16/045 257/E21.279 |
| 7,109,129 B1 | 9/2006 | Papasouliotis |
| 7,115,166 B2 | 10/2006 | Vaartstra et al. |
| 7,115,528 B2 | 10/2006 | Vaartstra et al. |
| 7,122,222 B2 | 10/2006 | Xiao et al. |
| 7,122,464 B2 | 10/2006 | Vaarstra |
| 7,125,815 B2 | 10/2006 | Vaarstra |
| 7,132,353 B1 | 11/2006 | Xia et al. |
| 7,141,278 B2 | 11/2006 | Koh et al. |
| 7,148,155 B1 | 12/2006 | Tarafdar et al. |
| 7,151,039 B2 | 12/2006 | Lee et al. |
| 7,172,792 B2 | 2/2007 | Wang et al. |
| 7,176,084 B2 | 2/2007 | Lee et al. |
| 7,205,187 B2 | 4/2007 | Leith et al. |
| 7,223,649 B2 | 5/2007 | Oh et al. |
| 7,235,484 B2 | 6/2007 | Nguyen et al. |
| 7,241,686 B2 | 7/2007 | Marcadal et al. |
| 7,244,668 B2 | 7/2007 | Kim |
| 7,250,083 B2 | 7/2007 | Sneh |
| 7,259,050 B2 | 8/2007 | Chen et al. |
| 7,261,919 B2 | 8/2007 | Mehregany et al. |
| 7,294,582 B2 | 11/2007 | Haverkort et al. |
| 7,297,641 B2 | 11/2007 | Todd et al. |
| 7,300,885 B2 | 11/2007 | Hasebe et al. |
| 7,314,835 B2 | 1/2008 | Ishizaka et al. |
| 7,341,959 B2 | 3/2008 | Brcka |
| 7,351,668 B2 | 4/2008 | Chou et al. |
| 7,361,538 B2 | 4/2008 | Luan et al. |
| 7,361,611 B2 | 4/2008 | Chakravarti et al. |
| 7,390,743 B2 | 6/2008 | Shin |
| 7,393,561 B2 | 7/2008 | Paranjpe |
| 7,399,388 B2 | 7/2008 | Moghadam et al. |
| 7,419,888 B2 | 9/2008 | Yang et al. |
| 7,435,454 B2 | 10/2008 | Brcka |
| 7,435,684 B1 | 10/2008 | Lang et al. |
| 7,462,571 B2 | 12/2008 | Hasebe et al. |
| 7,482,247 B1 | 1/2009 | Papasouliotis et al. |
| 7,488,694 B2 | 2/2009 | Kim et al. |
| 7,507,676 B2 | 3/2009 | Chou et al. |
| 7,510,984 B2 | 3/2009 | Saito et al. |
| 7,521,331 B2 | 4/2009 | Park et al. |
| 7,524,762 B2 | 4/2009 | Marcadal et al. |
| 7,544,615 B2 | 6/2009 | Vaartstra |
| 7,572,052 B2 | 8/2009 | Ravi et al. |
| 7,592,231 B2 | 9/2009 | Cheng et al. |
| 7,595,010 B2 | 9/2009 | Chakravarti et al. |
| 7,601,648 B2 | 10/2009 | Chua et al. |
| 7,615,438 B2 | 11/2009 | Ahn et al. |
| 7,615,449 B2 | 11/2009 | Chung et al. |
| 7,622,369 B1 | 11/2009 | Lee et al. |
| 7,622,383 B2 | 11/2009 | Kim et al. |
| 7,629,267 B2 | 12/2009 | Wan et al. |
| 7,632,757 B2 | 12/2009 | Matsuura |
| 7,633,125 B2 | 12/2009 | Lu et al. |
| 7,638,170 B2 | 12/2009 | Li |
| 7,645,484 B2 | 1/2010 | Ishizaka |
| 7,651,729 B2 | 1/2010 | Kim et al. |
| 7,651,730 B2 | 1/2010 | Hasebe |
| 7,651,953 B2 | 1/2010 | Todd et al. |
| 7,651,959 B2 | 1/2010 | Fukazawa et al. |
| 7,682,657 B2 | 3/2010 | Sherman |
| 7,687,409 B2 | 3/2010 | Ahn et al. |
| 7,713,592 B2 | 5/2010 | Nguyen et al. |
| 7,758,920 B2 | 7/2010 | Hasebe et al. |
| 7,776,733 B2 | 8/2010 | Hasegawa |
| 7,790,633 B1 | 9/2010 | Tarafdar et al. |
| 7,825,039 B2 | 11/2010 | Takahashi et al. |
| 7,863,190 B1 * | 1/2011 | Papasouliotis ........ C23C 14/046 257/E21.553 |
| 7,906,168 B2 | 3/2011 | Hasebe et al. |
| 7,919,416 B2 | 4/2011 | Lee et al. |
| 7,923,068 B2 | 4/2011 | Dickey et al. |
| 7,923,378 B2 | 4/2011 | Hasebe et al. |
| 7,959,985 B2 | 6/2011 | Ishizaka et al. |
| 7,964,241 B2 | 6/2011 | Hasebe et al. |
| 7,964,513 B2 | 6/2011 | Todd et al. |
| 7,972,980 B2 | 7/2011 | Lee et al. |
| 7,981,473 B2 | 7/2011 | Kim et al. |
| 7,989,365 B2 | 8/2011 | Park et al. |
| 8,034,673 B2 | 10/2011 | Kadonaga et al. |
| 8,080,290 B2 | 12/2011 | Hasebe et al. |
| 8,101,531 B1 | 1/2012 | Li et al. |
| 8,119,424 B2 | 2/2012 | Mather et al. |
| 8,119,544 B2 | 2/2012 | Hasebe et al. |
| 8,133,797 B2 | 3/2012 | van Schravendijk et al. |
| 8,178,448 B2 | 5/2012 | Nodera et al. |
| 8,227,032 B2 | 7/2012 | Dussarrat et al. |
| 8,257,789 B2 | 9/2012 | Matsunaga et al. |
| 8,278,224 B1 | 10/2012 | Mui et al. |
| 8,334,218 B2 | 12/2012 | Van Nooten et al. |
| 8,357,619 B2 | 1/2013 | Hasebe et al. |
| 8,366,953 B2 | 2/2013 | Kohno et al. |
| 8,383,525 B2 | 2/2013 | Raisanen et al. |
| 8,394,466 B2 | 3/2013 | Hong et al. |
| 8,524,612 B2 | 9/2013 | Li et al. |
| 8,592,328 B2 | 11/2013 | Hausmann et al. |
| 8,633,050 B2 | 1/2014 | Pierreux |
| 8,637,411 B2 | 1/2014 | Swaminathan et al. |
| 8,647,993 B2 | 2/2014 | Lavoie et al. |
| 8,669,185 B2 | 3/2014 | Onizawa et al. |
| 8,728,955 B2 | 5/2014 | LaVoie et al. |
| 8,728,956 B2 | 5/2014 | LaVoie et al. |
| 8,846,484 B2 | 9/2014 | Lee et al. |
| 8,956,983 B2 | 2/2015 | Swaminathan et al. |
| 8,999,859 B2 | 4/2015 | Swaminathan et al. |
| 9,023,693 B1 | 5/2015 | Lin et al. |
| 9,076,646 B2 | 7/2015 | Sims et al. |
| 9,214,334 B2 | 12/2015 | Swaminathan et al. |
| 9,230,800 B2 | 1/2016 | Lavoie et al. |
| 9,257,274 B2 | 2/2016 | Kang et al. |

(56) References Cited

U.S. PATENT DOCUMENTS

| | | |
|---|---|---|
| 9,287,113 B2 | 3/2016 | Kang et al. |
| 9,355,839 B2 | 5/2016 | Swaminathan et al. |
| 9,355,886 B2 | 5/2016 | Swaminathan et al. |
| 9,373,500 B2 | 6/2016 | Swaminathan et al. |
| 9,502,238 B2 | 11/2016 | Danek et al. |
| 9,564,312 B2 | 2/2017 | Henri et al. |
| 9,570,274 B2 | 2/2017 | Swaminathan et al. |
| 9,570,290 B2 | 2/2017 | Swaminathan et al. |
| 9,611,544 B2 | 4/2017 | Lavoie et al. |
| 9,673,041 B2 | 6/2017 | Swaminathan et al. |
| 9,685,320 B2 | 6/2017 | Kang et al. |
| 9,786,570 B2 | 10/2017 | Kang et al. |
| 9,793,110 B2 | 10/2017 | Kang et al. |
| 9,875,891 B2 | 1/2018 | Henri et al. |
| 9,892,917 B2 | 2/2018 | Swaminathan et al. |
| 2002/0076507 A1 | 6/2002 | Chiang et al. |
| 2003/0008070 A1 | 1/2003 | Seutter et al. |
| 2003/0024477 A1 | 2/2003 | Okuda et al. |
| 2003/0143839 A1 | 7/2003 | Raaijmakers et al. |
| 2003/0200917 A1 | 10/2003 | Vaartstra |
| 2004/0033698 A1 | 2/2004 | Lee et al. |
| 2004/0043633 A1 | 3/2004 | Vaartstra |
| 2004/0053515 A1 | 3/2004 | Comita et al. |
| 2004/0121164 A1 | 6/2004 | Iacovangelo et al. |
| 2004/0129212 A1 | 7/2004 | Gadgil et al. |
| 2004/0146644 A1 | 7/2004 | Xiao et al. |
| 2004/0157472 A1 | 8/2004 | Sugino et al. |
| 2004/0219746 A1 | 11/2004 | Vaartstra et al. |
| 2004/0231799 A1 | 11/2004 | Lee et al. |
| 2005/0005851 A1 | 1/2005 | Keshner et al. |
| 2005/0042865 A1 | 2/2005 | Cabral et al. |
| 2005/0079661 A1 | 4/2005 | Cho et al. |
| 2005/0100670 A1 | 5/2005 | Dussarrat et al. |
| 2005/0109276 A1 | 5/2005 | Iyer et al. |
| 2005/0118837 A1 | 6/2005 | Todd et al. |
| 2005/0158983 A1 | 7/2005 | Hoshi et al. |
| 2005/0159017 A1 | 7/2005 | Kim et al. |
| 2005/0181535 A1 | 8/2005 | Yun et al. |
| 2005/0184397 A1 | 8/2005 | Gates et al. |
| 2005/0196977 A1 | 9/2005 | Saito et al. |
| 2005/0208718 A1 | 9/2005 | Lim et al. |
| 2005/0230047 A1 | 10/2005 | Collins et al. |
| 2005/0233553 A1 | 10/2005 | Kountz et al. |
| 2005/0260347 A1 | 11/2005 | Narwankar et al. |
| 2005/0276099 A1 | 12/2005 | Horng et al. |
| 2005/0287775 A1 | 12/2005 | Hasebe et al. |
| 2006/0009041 A1 | 1/2006 | Iyer et al. |
| 2006/0030148 A1 | 2/2006 | Seutter et al. |
| 2006/0084283 A1 | 4/2006 | Paranjpe et al. |
| 2006/0088985 A1 | 4/2006 | Haverkort et al. |
| 2006/0165890 A1 | 7/2006 | Kaushal et al. |
| 2006/0183055 A1* | 8/2006 | O'Neill ............ H01L 21/02126 430/316 |
| 2006/0199357 A1 | 9/2006 | Wan et al. |
| 2006/0228868 A1 | 10/2006 | Ahn et al. |
| 2006/0286774 A1 | 12/2006 | Singh et al. |
| 2006/0286776 A1 | 12/2006 | Ranish et al. |
| 2006/0286818 A1 | 12/2006 | Wang et al. |
| 2007/0010071 A1 | 1/2007 | Matsuura |
| 2007/0026540 A1 | 2/2007 | Nooten et al. |
| 2007/0065576 A1 | 3/2007 | Singh et al. |
| 2007/0087574 A1 | 4/2007 | Gupta et al. |
| 2007/0087581 A1 | 4/2007 | Singh et al. |
| 2007/0116887 A1 | 5/2007 | Faguet |
| 2007/0134942 A1 | 6/2007 | Ahn et al. |
| 2007/0137572 A1 | 6/2007 | Matsuura et al. |
| 2007/0145483 A1 | 6/2007 | Ono |
| 2007/0167028 A1 | 7/2007 | Chou et al. |
| 2007/0215036 A1 | 9/2007 | Park et al. |
| 2007/0218701 A1 | 9/2007 | Shimizu et al. |
| 2007/0231487 A1 | 10/2007 | Ishizaka |
| 2007/0232082 A1 | 10/2007 | Balseanu et al. |
| 2007/0243693 A1* | 10/2007 | Nemani ............ H01L 21/76224 438/424 |
| 2007/0251444 A1 | 11/2007 | Gros-Jean et al. |
| 2007/0259110 A1 | 11/2007 | Mahajani et al. |
| 2008/0014759 A1 | 1/2008 | Chua et al. |
| 2008/0038936 A1 | 2/2008 | Todd et al. |
| 2008/0063791 A1 | 3/2008 | Hasebe et al. |
| 2008/0075881 A1 | 3/2008 | Won et al. |
| 2008/0081470 A1 | 4/2008 | Clark |
| 2008/0085610 A1 | 4/2008 | Wang et al. |
| 2008/0087890 A1 | 4/2008 | Ahn et al. |
| 2008/0123394 A1 | 5/2008 | Lee et al. |
| 2008/0131601 A1 | 6/2008 | Kim et al. |
| 2008/0138996 A1 | 6/2008 | Nishizuka |
| 2008/0139003 A1 | 6/2008 | Pirzada et al. |
| 2008/0207007 A1 | 8/2008 | Thridandam et al. |
| 2008/0213479 A1 | 9/2008 | Chou et al. |
| 2008/0242116 A1 | 10/2008 | Clark |
| 2008/0260969 A1 | 10/2008 | Dussarrat et al. |
| 2008/0274302 A1 | 11/2008 | Hasebe et al. |
| 2008/0311760 A1 | 12/2008 | Nodera et al. |
| 2008/0317972 A1 | 12/2008 | Hendriks et al. |
| 2009/0018668 A1 | 1/2009 | Galbraith |
| 2009/0039349 A1 | 2/2009 | Honda |
| 2009/0041952 A1 | 2/2009 | Yoon et al. |
| 2009/0065896 A1 | 3/2009 | Hwang et al. |
| 2009/0075490 A1 | 3/2009 | Dussarrat |
| 2009/0148625 A1 | 6/2009 | Yeom et al. |
| 2009/0155606 A1 | 6/2009 | Yoon et al. |
| 2009/0155968 A1 | 6/2009 | Min et al. |
| 2009/0163012 A1 | 6/2009 | Clark et al. |
| 2009/0191687 A1 | 7/2009 | Hong et al. |
| 2009/0191722 A1 | 7/2009 | Hasebe et al. |
| 2009/0203197 A1 | 8/2009 | Hanawa et al. |
| 2009/0208880 A1 | 8/2009 | Nemani et al. |
| 2009/0278224 A1 | 11/2009 | Kim et al. |
| 2010/0022099 A1 | 1/2010 | Van Nooten et al. |
| 2010/0025824 A1 | 2/2010 | Chen et al. |
| 2010/0048011 A1 | 2/2010 | Yeh et al. |
| 2010/0051578 A1 | 3/2010 | Chang et al. |
| 2010/0051579 A1 | 3/2010 | Kobayashi |
| 2010/0078316 A1 | 4/2010 | Edakawa et al. |
| 2010/0096688 A1 | 4/2010 | Balseanu et al. |
| 2010/0099236 A1 | 4/2010 | Kwon et al. |
| 2010/0099271 A1 | 4/2010 | Hausmann et al. |
| 2010/0102417 A1 | 4/2010 | Ganguli et al. |
| 2010/0120262 A1 | 5/2010 | Vorsa et al. |
| 2010/0124618 A1 | 5/2010 | Kobayashi et al. |
| 2010/0124621 A1 | 5/2010 | Kobayashi et al. |
| 2010/0136260 A1 | 6/2010 | Matsunaga et al. |
| 2010/0136313 A1 | 6/2010 | Shimizu et al. |
| 2010/0167555 A1 | 7/2010 | Maula et al. |
| 2010/0190353 A1 | 7/2010 | Nguyen et al. |
| 2010/0197129 A1 | 8/2010 | Ishikawa |
| 2010/0216268 A1 | 8/2010 | Katayama et al. |
| 2010/0221925 A1 | 9/2010 | Lee et al. |
| 2010/0255218 A1 | 10/2010 | Oka et al. |
| 2010/0304047 A1 | 12/2010 | Yang et al. |
| 2010/0304574 A1 | 12/2010 | Nodera et al. |
| 2010/0310791 A1 | 12/2010 | Shimazu et al. |
| 2011/0003445 A1 | 1/2011 | Murata et al. |
| 2011/0014795 A1 | 1/2011 | Lee et al. |
| 2011/0014796 A1 | 1/2011 | Hayashi |
| 2011/0014798 A1 | 1/2011 | Mallick et al. |
| 2011/0042744 A1 | 2/2011 | Cheng et al. |
| 2011/0064969 A1 | 3/2011 | Chen et al. |
| 2011/0086516 A1 | 4/2011 | Lee et al. |
| 2011/0124187 A1 | 5/2011 | Afzali-Ardakani et al. |
| 2011/0139176 A1 | 6/2011 | Cheung et al. |
| 2011/0143548 A1 | 6/2011 | Cheung et al. |
| 2011/0151142 A1 | 6/2011 | Seamons et al. |
| 2011/0151246 A1 | 6/2011 | Ramon Moreno et al. |
| 2011/0151674 A1 | 6/2011 | Tang et al. |
| 2011/0151678 A1 | 6/2011 | Ashtiani et al. |
| 2011/0159202 A1 | 6/2011 | Matsushita et al. |
| 2011/0176967 A1 | 7/2011 | Okuda et al. |
| 2011/0198756 A1 | 8/2011 | Thenappan et al. |
| 2011/0201210 A1 | 8/2011 | Sato et al. |
| 2011/0215445 A1 | 9/2011 | Yang et al. |
| 2011/0256726 A1 | 10/2011 | LaVoie et al. |
| 2011/0256734 A1 | 10/2011 | Hausmann et al. |
| 2011/0298099 A1 | 12/2011 | Lee et al. |

(56) References Cited

U.S. PATENT DOCUMENTS

| | | |
|---|---|---|
| 2011/0309475 A1 | 12/2011 | Lee |
| 2012/0009802 A1 | 1/2012 | LaVoie et al. |
| 2012/0009803 A1 | 1/2012 | Jung et al. |
| 2012/0021252 A1 | 1/2012 | Lee |
| 2012/0028454 A1 | 2/2012 | Swaminathan et al. |
| 2012/0028469 A1 | 2/2012 | Onizawa et al. |
| 2012/0058282 A1 | 3/2012 | Hong et al. |
| 2012/0064682 A1 | 3/2012 | Jang et al. |
| 2012/0077349 A1 | 3/2012 | Li et al. |
| 2012/0086048 A1 | 4/2012 | Park et al. |
| 2012/0108079 A1 | 5/2012 | Mahajani |
| 2012/0113672 A1 | 5/2012 | Dubrow et al. |
| 2012/0164846 A1 | 6/2012 | Ha et al. |
| 2012/0193693 A1 | 8/2012 | Kanaya |
| 2012/0213940 A1 | 8/2012 | Mallick |
| 2012/0280200 A1 | 11/2012 | Tada et al. |
| 2012/0282418 A1 | 11/2012 | Chou et al. |
| 2012/0315394 A1 | 12/2012 | Ito |
| 2013/0040447 A1 | 2/2013 | Swaminathan et al. |
| 2013/0058161 A1 | 3/2013 | Yamanaka et al. |
| 2013/0058162 A1 | 3/2013 | Yamanaka et al. |
| 2013/0071580 A1 | 3/2013 | Weidman et al. |
| 2013/0084688 A1 | 4/2013 | O'Meara et al. |
| 2013/0115783 A1 | 5/2013 | Kim et al. |
| 2013/0189854 A1 | 7/2013 | Hausmann et al. |
| 2013/0196516 A1 | 8/2013 | Lavoie et al. |
| 2013/0252437 A1 | 9/2013 | Sano et al. |
| 2013/0309415 A1 | 11/2013 | Swaminathan et al. |
| 2013/0319329 A1 | 12/2013 | Li et al. |
| 2013/0344248 A1 | 12/2013 | Clark |
| 2014/0030444 A1 | 1/2014 | Swaminathan et al. |
| 2014/0051262 A9 | 2/2014 | Lavoie et al. |
| 2014/0087066 A1 | 3/2014 | Wang et al. |
| 2014/0106574 A1 | 4/2014 | Kang et al. |
| 2014/0113457 A1 | 4/2014 | Sims et al. |
| 2014/0120270 A1 | 5/2014 | Tour et al. |
| 2014/0120737 A1 | 5/2014 | Swaminathan et al. |
| 2014/0134827 A1 | 5/2014 | Swaminathan et al. |
| 2014/0141542 A1 | 5/2014 | Kang et al. |
| 2014/0141626 A1 | 5/2014 | Hausmann et al. |
| 2014/0182619 A1 | 7/2014 | Goto et al. |
| 2014/0209562 A1 | 7/2014 | LaVoie et al. |
| 2014/0216337 A1 | 8/2014 | Swaminathan et al. |
| 2014/0262038 A1 | 9/2014 | Wang et al. |
| 2014/0264555 A1 | 9/2014 | Ahn et al. |
| 2014/0273428 A1 | 9/2014 | Shero et al. |
| 2014/0273528 A1 | 9/2014 | Niskanen et al. |
| 2014/0295084 A1 | 10/2014 | Shirai et al. |
| 2014/0302686 A1 | 10/2014 | Pan et al. |
| 2015/0041867 A1 | 2/2015 | Han |
| 2015/0093902 A1 | 4/2015 | Huang et al. |
| 2015/0109814 A1 | 4/2015 | Chen et al. |
| 2015/0126042 A1 | 5/2015 | Pasquale et al. |
| 2015/0147483 A1 | 5/2015 | Fukazawa |
| 2015/0159271 A1 | 6/2015 | Lee et al. |
| 2015/0170900 A1 | 6/2015 | LaVoie |
| 2015/0206719 A1 | 7/2015 | Swaminathan et al. |
| 2015/0235835 A1 | 8/2015 | Swaminathan et al. |
| 2015/0243883 A1 | 8/2015 | Swaminathan et al. |
| 2015/0249013 A1 | 9/2015 | Arghavani et al. |
| 2015/0294905 A1 | 10/2015 | Wu et al. |
| 2016/0020092 A1 | 1/2016 | Kang et al. |
| 2016/0064211 A1 | 3/2016 | Swaminathan et al. |
| 2016/0118246 A1 | 4/2016 | Kang et al. |
| 2016/0148800 A1 | 5/2016 | Henri et al. |
| 2016/0148806 A1 | 5/2016 | Henri et al. |
| 2016/0155676 A1 | 6/2016 | Kang et al. |
| 2016/0163539 A9 | 6/2016 | Kang et al. |
| 2016/0163972 A1 | 6/2016 | Swaminathan et al. |
| 2016/0240428 A1 | 8/2016 | Tung et al. |
| 2016/0251756 A1 | 9/2016 | Lansalot-Matras et al. |
| 2016/0293398 A1 | 10/2016 | Danek et al. |
| 2016/0293838 A1 | 10/2016 | Swaminathan et al. |
| 2016/0322371 A1 | 11/2016 | Yonemochi |
| 2016/0329206 A1 | 11/2016 | Kumar et al. |
| 2016/0336178 A1 | 11/2016 | Swaminathan et al. |
| 2016/0365425 A1 | 12/2016 | Chen et al. |
| 2016/0379826 A9 | 12/2016 | Arghavani et al. |
| 2017/0092735 A1 | 3/2017 | Hashemi et al. |
| 2017/0103891 A1 | 4/2017 | Lee et al. |
| 2017/0110364 A1 | 4/2017 | Song et al. |
| 2017/0110533 A1 | 4/2017 | Huang et al. |
| 2017/0117134 A1 | 4/2017 | Henri et al. |
| 2017/0117150 A1 | 4/2017 | Liao et al. |
| 2017/0140926 A1 | 5/2017 | Pore et al. |
| 2017/0148628 A1 | 5/2017 | Swaminathan et al. |
| 2017/0226637 A1 | 8/2017 | Lubomirsky et al. |
| 2017/0263450 A1 | 9/2017 | Swaminathan et al. |
| 2017/0316988 A1 | 11/2017 | Kang et al. |
| 2017/0323786 A1 | 11/2017 | Kang et al. |
| 2018/0005801 A1 | 1/2018 | Singhal et al. |
| 2018/0005814 A1 | 1/2018 | Kumar et al. |

FOREIGN PATENT DOCUMENTS

| | | |
|---|---|---|
| CN | 101006195 A | 7/2007 |
| CN | 101255548 A | 9/2008 |
| CN | 101378007 A | 3/2009 |
| CN | 101416293 A | 4/2009 |
| CN | 101535524 A | 9/2009 |
| CN | 101889331 A | 11/2010 |
| CN | 102191479 A | 9/2011 |
| CN | 102687249 A | 9/2012 |
| CN | 102906304 A | 1/2013 |
| CN | 103137864 A | 6/2013 |
| EP | 0 277 766 | 8/1988 |
| EP | 0 541 212 | 5/1993 |
| EP | 1 703 552 A2 | 9/2006 |
| EP | 2 278 046 | 1/2011 |
| JP | S48-043472 A | 6/1973 |
| JP | H02-093071 A | 4/1990 |
| JP | H03-011635 | 1/1991 |
| JP | H06-177120 A | 6/1994 |
| JP | H09-102494 A | 4/1997 |
| JP | H09-219401 A | 8/1997 |
| JP | 10-98032 | 4/1998 |
| JP | H11-172439 | 6/1999 |
| JP | 2001-274404 | 10/2001 |
| JP | 2001-338922 A | 12/2001 |
| JP | 2002-009072 | 1/2002 |
| JP | 2002-134497 A | 5/2002 |
| JP | 2002-164345 A | 6/2002 |
| JP | 2002-539640 A | 11/2002 |
| JP | 2005-210076 A | 8/2005 |
| JP | 2005-310927 | 11/2005 |
| JP | 2006-060091 | 3/2006 |
| JP | 2007-165883 | 6/2007 |
| JP | 2007-180362 A | 7/2007 |
| JP | 2007-287889 A | 11/2007 |
| JP | 2007-287890 A | 11/2007 |
| JP | 2008-500742 A | 1/2008 |
| JP | 2008-506262 A | 2/2008 |
| JP | 2008-109093 A | 5/2008 |
| JP | 2008-517479 | 5/2008 |
| JP | 2008-182199 A | 8/2008 |
| JP | 2008-258591 A | 10/2008 |
| JP | 2009-65203 A | 3/2009 |
| JP | 2009-540128 A | 11/2009 |
| JP | 4364320 B2 | 11/2009 |
| JP | 2010-10497 | 1/2010 |
| JP | 2010-043081 A | 2/2010 |
| JP | 2010-103484 A | 5/2010 |
| JP | 2010-118664 A | 5/2010 |
| JP | 2010-152136 | 7/2010 |
| JP | 2010-183069 A | 8/2010 |
| JP | 2010-245518 A | 10/2010 |
| JP | 2010-283388 A | 12/2010 |
| JP | 2011-023576 A | 2/2011 |
| JP | 2011-023655 A | 2/2011 |
| JP | 2011-187934 A | 9/2011 |
| JP | 2012-199306 | 10/2012 |
| JP | 2013166965 A | 8/2013 |
| JP | 2013225655 A | 10/2013 |
| JP | 2014-532304 A | 12/2014 |

(56) References Cited

FOREIGN PATENT DOCUMENTS

| KR | 10-2011-0111448 | 12/2001 |
| KR | 10-0356473 B1 | 10/2002 |
| KR | 10-2004-0001036 | 1/2004 |
| KR | 10-2006-0056883 | 5/2006 |
| KR | 10-0734748 B | 7/2007 |
| KR | 10-2009-0057665 | 6/2009 |
| KR | 10-2009-0080019 | 7/2009 |
| KR | 10-2009-0081396 | 7/2009 |
| KR | 10-2009-0116433 | 11/2009 |
| KR | 10-20130056608 A | 5/2013 |
| TW | 200701341 | 1/2007 |
| TW | 201009942 A | 3/2010 |
| TW | 201042706 A1 | 12/2010 |
| TW | 2011/13934 A1 | 4/2011 |
| TW | 201140695 A1 | 11/2011 |
| TW | 201144475 A1 | 12/2011 |
| WO | WO 2004/032196 | 4/2004 |
| WO | WO 2006/014471 | 2/2006 |
| WO | WO 2006/018441 | 2/2006 |
| WO | WO 2006/026350 | 3/2006 |
| WO | WO 2006/104741 | 10/2006 |
| WO | WO 2007/043709 | 4/2007 |
| WO | WO 2007/118026 | 10/2007 |
| WO | WO 2011/087850 | 7/2011 |
| WO | WO 2011/130326 | 10/2011 |
| WO | WO 2011/130397 | 10/2011 |
| WO | WO 2012/040317 | 3/2012 |
| WO | WO 2012/048094 | 4/2012 |
| WO | WO 2012/087737 | 6/2012 |
| WO | WO 2013/032786 | 3/2013 |
| WO | WO 2013/043330 | 3/2013 |
| WO | WO 2013/065806 | 5/2013 |
| WO | WO 2013/112727 | 8/2013 |

OTHER PUBLICATIONS

U.S. Appl. No. 15/224,347, filed Jul. 29, 2016, entitled "Plasma Assisted Atomic Layer Deposition of Multi-Layer Films for Patterning Applications."
U.S. Appl. No. 15/178,474, filed Jun. 9, 2016, entitled "Plasma Assisted Atomic Layer Deposition Titanium Oxide for Patterning Applications."
U.S. Appl. No. 14/552,245, filed Nov. 24, 2014, entitled "Method of Depositing Amnonia Free and Chlorine Free Conformal Silicon Nitride Film."
U.S. Appl. No. 14/552,011, filed Nov. 24, 2014, entitled "Selective Inhibition in Atomic Layer Deposition of Silicon-Containing Films."
U.S. Appl. No. 14/678,736, filed Apr. 3, 2015, entitled "Deposition of Conformal Films by Atomic Layer Deposition and Atomic Layer Etch."
U.S. Appl. No. 15/201,221, filed Jul. 1, 2016, entitled "Selective Atomic Layer Deposition With Post-Dose Treatment."
U.S. Office Action dated Mar. 15, 2013 issued in U.S. Appl. No. 13/084,399.
U.S. Final Office Action dated Sep. 13, 2013 issued in U.S. Appl. No. 13/084,399.
U.S. Notice of Allowance dated Jan. 15, 2014 issued in U.S. Appl. No. 13/084,399.
U.S. Office Action dated Jan. 2, 2015 issued in U.S. Appl. No. 14/231,554.
U.S. Final Office Action dated Jun. 10, 2015 issued in U.S. Appl. No. 14/231,554.
U.S. Notice of Allowance dated Aug. 31, 2015 issued in U.S. Appl. No. 14/231,554.
U.S. Office Action dated Sep. 14, 2012 issued in U.S. Appl. No. 13/084,305.
U.S. Final Office Action dated Apr. 25, 2013 issued in U.S. Appl. No. 13/084,305.
U.S. Office Action dated Apr. 13, 2011 issued in U.S. Appl. No. 12/889,132.
U.S. Notice of Allowance dated Sep. 30, 2011 issued in U.S. Appl. No. 12/889,132.
U.S. Office Action dated Aug. 1, 2012 issued in U.S. Appl. No. 13/011,569.
U.S. Final Office Action dated Feb. 26, 2013 issued in U.S. Appl. No. 13/011,569.
U.S. Notice of Allowance dated May 6, 2013 issued in U.S. Appl. No. 13/011,569.
U.S. Office Action dated Jul. 1, 2016 issued in U.S. Appl. No. 13/963,212.
U.S. Office Action dated Apr. 4, 2013 issued U.S. Appl. No. 13/242,084.
U.S. Notice of Allowance dated Jun. 19, 2013 issued U.S. Appl. No. 13/242,084.
U.S. Notice of Allowance dated Sep. 19, 2013 issued U.S. Appl. No. 13/242,084.
U.S. Office Action dated Sep. 21, 2015 issued U.S. Appl. No. 14/607,997.
U.S. Final Office Action dated Mar. 18, 2016 issued U.S. Appl. No. 14/607,997.
U.S. Notice of Allowance dated Jun. 16, 2016 issued U.S. Appl. No. 14/607,997.
U.S. Notice of Allowance dated Aug. 7, 2014 issued U.S. Appl. No. 14/133,239.
U.S. Notice of Allowance dated Nov. 26, 2014 issued U.S. Appl. No. 14/133,239.
U.S. Office Action dated Apr. 29, 2013 issued U.S. Appl. No. 13/224,240.
U.S. Final Office Action dated Nov. 22, 2013 issued U.S. Appl. No. 13/224,240.
US Examiner's Answer to Appeal Brief (filed May 22, 2014) Before the Patent Trial and Appeal Board dated Aug. 14, 2014 issued U.S. Appl. No. 13/224,240.
US Patent Board Decision on Appeal Before the Patent Trial and Appeal Board dated Aug. 11, 2016 issued U.S. Appl. No. 13/224,240.
U.S. Office Action dated Jun. 7, 2013 issued U.S. Appl. No. 13/414,619.
U.S. Notice of Allowance dated Jul. 26, 2013, issued U.S. Appl. No. 13/414,619.
U.S. Office Action dated May 24, 2013 issued U.S. Appl. No. 13/472,282.
U.S. Notice of Allowance dated Oct. 4, 2013 issued U.S. Appl. No. 13/472,282.
U.S. Office Action dated May 21, 2014 issued in U.S. Appl. No. 13/607,386.
U.S. Notice of Allowance dated Oct. 8, 2014 issued in U.S. Appl. No. 13/607,386.
U.S. Notice of Allowance dated Nov. 19, 2014 issued in U.S. Appl. No. 13/607,386.
U.S. Office Action dated Jun. 13, 2014 issued in U.S. Appl. No. 13/953,616.
U.S. Final Office Action dated Nov. 24, 2014 issued in U.S. Appl. No. 13/953,616.
U.S. Office Action dated Dec. 11, 2014 issued in U.S. Appl. No. 14/074,596.
U.S. Office Action dated Dec. 24, 2015 issued in U.S. Appl. No. 14/074,596.
U.S. Notice of Allowance dated Feb. 12, 2016 issued in U.S. Appl. No. 14/074,596.
U.S. Office Action dated May 15, 2015 issued in U.S. Appl. No. 14/074,617.
U.S. Notice of Allowance dated Nov. 20, 2015 issued in U.S. Appl. No. 14/074,617.
U.S. Office Action dated Aug. 14, 2015 issued in U.S. Appl. No. 14/061,587.
U.S. Notice of Allowance dated Feb. 11, 2016 issued in U.S. Appl. No. 14/061,587.
U.S. Notice of Allowance [Supplemental Notice of Allowability] dated Mar. 1, 2016 issued in U.S. Appl. No. 14/061,587.
U.S. Office Action dated Mar. 2, 2015 issued in U.S. Appl. No. 14/137,860.

(56) References Cited

OTHER PUBLICATIONS

U.S. Notice of Allowance dated Oct. 1, 2015 issued in U.S. Appl. No. 14/137,860.
U.S. Notice of Allowance [Supplemental Notice of Allowability] dated Oct. 22, 2015 issued in U.S. Appl. No. 14/137,860.
U.S. Office Action dated Jul. 10, 2014 issued in U.S. Appl. No. 14/144,107.
U.S. Final Office Action dated Jan. 15, 2015 issued in U.S. Appl. No. 14/144,107.
U.S. Notice of Allowance dated Mar. 19, 2015 issued in U.S. Appl. No. 14/144,107.
U.S. Office Action dated Oct. 21, 2015 issued in U.S. Appl. No. 14/194,549.
U.S. Notice of Allowance dated Aug. 5, 2015 issued in U.S. Appl. No. 14/183,287.
U.S. Office Action dated Aug. 1, 2016 issued in U.S. Appl. No. 14/932,869.
U.S. Office Action dated Jul. 2, 2015 issued in U.S. Appl. No. 14/187,145.
U.S. Final Office Action dated Dec. 16, 2015 issued in U.S. Appl. No. 14/187,145.
U.S. Notice of Allowance dated Feb. 25, 2016 issued in U.S. Appl. No. 14/187,145.
U.S. Office Action dated Jun. 14, 2016 issued in U.S. Appl. No. 15/019,904.
U.S. Office Action dated Apr. 13, 2015 issued in U.S. Appl. No. 14/335,785.
U.S. Final Office Action dated Aug. 24, 2016 issued in U.S. Appl. No. 14/335,785.
U.S. Office Action dated Oct. 1, 2015 issued in U.S. Appl. No. 14/552,245.
U.S. Office Action dated May 25, 2016 issued in U.S. Appl. No. 14/552,011.
U.S. Notice of Allowance dated Jul. 15, 2016 issued in U.S. Appl. No. 14/678,736.
PCT International Search Report and Written Opinion, dated Oct. 20, 2011, issued in PCT/US2011/032186.
PCT International Preliminary Report on Patentability, dated Oct. 26, 2012, issued in PCT/US2011/032186.
Taiwan Office Action dated Apr. 27, 2016 issued in Application No. TW 100113041.
PCT Invitation to Pay Additional Fees; Communication Re Partial International Search, dated Dec. 16, 2011, issued in PCT/US2011/032303.
PCT International Search Report and Written Opinion, dated Feb. 20, 2012, issued in PCT/US2011/032303.
PCT International Preliminary Report on Patentability and Written Opinion, dated Oct. 26, 2012, issued in PCT/US2011/032303.
PCT International Search Report and Written Opinion dated May 2, 2012 issued in Application No. PCT/US2011/052537.
PCT International Preliminary Report on Patentability and Written Opinion dated Apr. 4, 2013 issued in Application No. PCT/US2011/052537.
Chinese First Office Action dated Jun. 2, 2015 issued in Application No. CN 201180045808.6.
Chinese Second Office Action dated Feb. 2, 2016 issued in Application No. CN 201180045808.6.
Taiwan Office Action dated May 5, 2016 issued in TW 100134208.
PCT International Search Report and Written Opinion dated Dec. 18, 2012, issued in Application No. PCT/US2012/052769.
PCT International Preliminary Report on Patentability and Written Opinion dated Apr. 3, 2014, issued in Application No. PCT/US2012/052769.
Chinese First Office Action dated Nov. 19, 2015 issued in Application No. CN 201280046487.6.
Taiwan Notice of Allowance and Search Report dated Dec. 18, 2015 issued in Application No. TW 101134692.
PCT International Search Report and Written Opinion dated Feb. 28, 2013, issued in Application No. PCT/US2012/051740.

PCT International Preliminary Report on Patentability and Written Opinion dated Mar. 13, 2014, issued in Application No. PCT/US2012/051740.
Chinese First Office Action dated Nov. 6, 2015 issued in Application No. CN 201280053888.4.
Chinese Second Office Action dated Aug. 16, 2016 issued in Application No. CN 201280053888.4.
Taiwan Office Action and Search Report dated Jan. 27, 2016 issued in Application No. TW 101134692.
Chinese First Office Action dated May 19, 2016 issued in CN 201310021460.8.
European Extended Search Report dated Apr. 14, 2014 issued in Application No. EP 13 15 2046.
Korean Notice of Provisional Rejection dated Dec. 6, 2013 issued in Application No. KR 10-2012-0043797.
Korean Final Office Action dated Aug. 18, 2014 issued in Application No. KR 10-2012-0043797.
Korean Decision from the Patent Tribunal of the KIPO (description) dated May 26, 2015 issued in Application No. KR 10-2012-0043797.
PCT International Search Report and Written Opinion dated May 27, 2013, issued in Application No. PCT/US2013/022977.
PCT International Preliminary Report on Patentability and Written Opinion dated Aug. 7, 2014, issued in Application No. PCT/US2013/022977.
Chinese First Office Action dated Feb. 22, 2016 issued in Application No. CN 201380006994.1.
Taiwan Office Action and Search Report dated Jul. 20, 2016 issued in Application No. TW 102102879.
Chinese First Office Action dated Apr. 11, 2016 issued in Application No. CN 201510086588.1.
Japanese Office Action dated Apr. 19, 2016 issued in Application No. JP 2015-21804.
Korean First Office Action dated Feb. 19, 2016, issued in Application No. KR 10-2015-0022610.
Korean Final Office Action dated Jun. 29, 2016, issued in Application No. KR 10-2015-0022610.
Cecchi et al., (2007) "Ultra-thin conformal pore-sealing of low-k materials by plasma-assisted ALD," *University of New Mexico, Albuquerque, NM, Sandia National Labs, Albuquerque, NM*, 1 page.
Choi, Gyu-Jin et al., (2009) "Plasma-enhanced atomic layer deposition of $TiO_2$ and Al-doped $TiO_2$ films using $N_2O$ and $O_2$ reactants," *Journal of the Electrochemical Society*, 156(9):G138-G143.
Hausmann et al., (2002) "Atomic Layer Deposition of Hafnium and Zirconium Oxides Using Metal Amide Precursors," *Chem. Mater.* 14(10):4350-4358.
Kim, H., et al., (2002) "The Growth of Tantalum Thin Films by Plasma-Enhanced Atomic Layer Deposition and Diffusion Barrier Properties," *Mat. Res. Soc. Symp. Proc.* 716:B8.5.1-B8.5.6.
King, Sean W., (Jul./Aug. 2011) "Plasma enhanced atomic layer deposition of $SiN_x$:H and $SiO_2$," *J. Vac. Sci. Technol.* A29(4):041501-1 through 041501-9 (9 pages).
Ko, Myoung-Gyun, et al., "Characterization of ruthenium thin film deposited by rf-direct plasma atomic layer deposition," *209th ECS Meeting*, Abstract #50, p. 1 [Downloaded on Jun. 9, 2014].
Ko, Myoung-Gyun, et al., (Oct. 2008) "Correlation of Carbon Content with the Thermal Stability of Ruthenium Deposited by Using RF-Direct Plasma-Enhanced Atomic-Layer Deposition," *Journal of the Korean Physical Society*, 53(4):2123-2128.
Lavareda et al., (2004) "Properties of a-Si:H TFTs using silicon carbonitride as dielectric," *Journal of Non-Crystalline Solids*, 338-340:797-801.
Lee et al., (2005) "Chemically conformal deposition of $SrTiO_3$ thin films by Atomic Layer Deposition using conventional metal organic precursors and remote-plasma activated $H_2O$," School of Materials Science and Engineering, and Inter-university Semiconductor Research Center, Seoul National University, *Microelectronic Engineering* 80:158-161.
Lee, Jong Ju, (2005) "Low-impurity, highly conformal atomic layer deposition of titanium nitride using $NH_3$—Ar—$H_2$ plasma treatment for capacitor electrodes," *Materials Letters*, 59:615-617.

(56) References Cited

OTHER PUBLICATIONS

Li, Xingcun, et al., (2011) "Atomic Layer Deposition $Al_2O_3$ Thin Films in Magnetized Radio Frequency Plasma Source," *Physics Procedia* 18:100-106.
Man P.F. et al., (Feb. 11-15, 1996) "Elimination of Post-Release Adhesion in Microstructures Using Conformal Fluorocarbon Coatings," *MEMS '96 Proceedings, IEEE*, pp. 55-60.
Nguyen, S.V. et al., (Jan./Mar. 1999) "Plasma-assist chemical vapor deposition of dielectric thin films for ULSI semiconductor circuits," *IBM J.Res.Develop.* 43(1.2):5-38.
Plasma Enhanced Atomic Layer Deposition (PEALD), Website: http://www.asm.com/index.php?option=com_content&task=view&id=19&Itemid=161 (2010), 1 page.
"PlasmaPro™ NGP® 80 Range," *Oxford Instruments* (2010), 8 pages.
Puurunen, Riikka L. (2005) "Surface chemistry of atomic layer deposition: A case study for the trimethylaluminum/water process," *Journal of Applied Physics*, 97:121301-1-121301-52.
Van der Straten et al., (2004) "Atomic layer deposition of tantalum nitride for ultrathin liner applications in advanced copper metallization schemes," *Journal of Materials Research*, 19(2):447-453.
U.S. Office Action dated Jan. 12, 2017 issued in U.S. Appl. No. 13/963,212.
U.S. Final Office Action dated Jun. 28, 2017 issued in U.S. Appl. No. 13/963,212.
U.S. Notice of Allowance dated Sep. 27, 2016 issued U.S. Appl. No. 14/607,997.
U.S. Office Action dated Sep. 26, 2017 issued in U.S. Appl. No. 15/426,889.
U.S. Notice of Allowance dated Nov. 17, 2016 issued U.S. Appl. No. 13/224,240.
U.S. Notice of Allowance (Supplemental Notice of Allowability) dated Feb. 21, 2017 issued U.S. Appl. No. 13/224,240.
U.S. Office Action dated Dec. 30, 2016 issued in U.S. Appl. No. 15/015,952.
U.S. Notice of Allowance dated Jun. 15, 2017 issued in U.S. Appl. No. 15/015,952.
U.S. Office Action dated Feb. 3, 2017 issued in U.S. Appl. No. 14/987,542.
U.S. Notice of Allowance dated Jun. 20, 2017 issued in U.S. Appl. No. 14/987,542.
U.S. Notice of Allowance dated Aug. 22, 2017 issued in U.S. Appl. No. 14/987,542.
U.S. Final Office Action dated Nov. 1, 2016 issued in U.S. Appl. No. 14/194,549.
U.S. Office Action dated Apr. 19, 2017 issued in U.S. Appl. No. 14/194,549.
U.S. Final Office Action dated Sep. 20, 2017 issued in U.S. Appl. No. 14/194,549.
U.S. Office Action dated Jun. 9, 2017 issued in U.S. Appl. No. 15/224,347.
U.S. Notice of Allowance dated Oct. 4, 2017 issued in U.S. Appl. No. 15/224,347.
U.S. Notice of Allowance [Corrected Notice of Allowability] dated Nov. 28, 2017 issued in U.S. Appl. No. 15/224,347.
U.S. Notice of Allowance dated Oct. 13, 2016 issued in U.S. Appl. No. 15/019,904.
U.S. Office Action dated Nov. 25, 2016 issued in U.S. Appl. No. 15/178,474.
U.S. Notice of Allowance dated Feb. 10, 2017 issued in U.S. Appl. No. 15/178,474.
U.S. Notice of Allowance dated Mar. 27, 2017 issued in U.S. Appl. No. 15/178,474.
U.S. Notice of Allowance dated Apr. 18, 2017 issued in U.S. Appl. No. 15/178,474.
U.S. Office Action dated Aug. 22, 2017 issued in U.S. Appl. No. 15/609,864.
U.S. Final Office Action dated Dec. 4, 2017 issued in U.S. Appl. No. 15/609,864.
U.S. Notice of Allowance dated Nov. 4, 2016 issued in U.S. Appl. No. 14/335,785.
U.S. Notice of Allowance dated Feb. 22, 2017 issued in U.S. Appl. No. 14/335,785.
U.S. Notice of Allowance dated Mar. 21, 2017 issued in U.S. Appl. No. 14/335,785.
U.S. Notice of Allowance [Corrected Notice of Allowability] dated Apr. 19, 2017 issued in U.S. Appl. No. 14/335,785.
U.S. Notice of Allowance dated Sep. 26, 2016 issued in U.S. Appl. No. 14/552,011.
U.S. Notice of Allowance dated Sep. 28, 2017 issued in U.S. Appl. No. 15/399,637.
U.S. Office Action dated Aug. 18, 2017 issued in U.S. Appl. No. 15/201,221.
Korean Office Action, dated Feb. 7, 2017, issued in Application No. KR 10-2012-7004925.
Korean Office Action, dated Aug. 23, 2017, issued in Application No. KR 10-2017-7020548.
Korean Office Action, dated May 23, 2017, issued in Application No. KR 10-2013-7010291.
Korean Office Action, dated Nov. 27, 2017, issued in Application No. KR 10-2013-7010291.
Taiwan Office Action dated Oct. 19, 2017 issued in Application No. TW 105130207.
Chinese Second Office Action dated Aug. 22, 2016 issued in Application No. CN 201280046487.6.
Japanese Office Action dated Aug. 23, 2016 issued in Application No. JP 2014-531838.
Singapore Supplementary Examination Report dated Jun. 1, 2016 issued in Application No. SG 11201400633R.
Korean First Office Action dated Oct. 31, 2017 issued in Application No. KR 10-2014-7008696.
Taiwan Office Action and Search Report dated Jan. 27, 2016 issued in Application No. TW 101131556.
Taiwan Office Action and Search Report dated Nov. 9, 2016 issued in Application No. TW 101131556.
Chinese Second Office Action dated Apr. 13, 2017 issued in Application No. CN 201310021460.8.
Chinese Third Office Action dated Oct. 17, 2017 issued in Application No. CN 201310021460.8.
European Examination Report dated Dec. 11, 2017 issued in Application No. EP 13 15 2046.
Japanese Office Action dated Jan. 10, 2017 issued in Application No. JP 2013-007612.
Taiwan Examination Report dated Mar. 29, 2017 issued in Application No. TW 102102054.
Chinese Second Office Action dated Feb. 6, 2017 issued in Application No. CN 201380006994.1.
Japanese Notification of Reasons for Rejection dated Jan. 10, 2017 issued in Application No. JP2014-554825.
Japanese Decision of Refusal dated Dec. 5, 2017 issued in Application No. JP2014-554825.
Singapore Supplementary Examination Report dated Aug. 11, 2016 issued in Application No. SG 11201404315R.
Taiwan Office Action dated Oct. 25, 2016 issued in Application No. TW 102117772.
Taiwan Rejection Decision dated Aug. 17, 2017 issued in Application No. TW 102117772.
Japanese Office Action dated Oct. 31, 2017 issued in Application No. JP 2013-230782.
Japanese Office Action dated Dec. 5, 2017 issued in Application No. JP 2013-231188.
Taiwan Examination Report dated Jul. 13, 2017 issued in Application No. TW 102140721.
Taiwan Examination Report dated Jan. 11, 2017 issued in Application No. TW 102138326.
Chinese First Office Action dated Nov. 28, 2016 issued in Application No. CN 201410521390.7.
Chinese First Office Action dated May 27, 2017 issued in Application No. CN 201510091775.9.
Chinese Second Office Action dated Mar. 20, 2017 issued in Application No. CN 201510086588.1.

(56) References Cited

OTHER PUBLICATIONS

Faraz et al., (2015) "Atomic Layer Etching: What Can We Learn from Atomic Layer Deposition?," *ECS Journal of Solid State Science and Technology*, 4(6):N5023-N5032.
Pritchett, Merry, (May 2004) "Adherence/Diffusion Barrier Layers for Copper Metallization: Amorphous Carbon:Silicon Polymerized Films," Dissertation Prepared for the Degree of Doctor of Philosophy, University of Texas, 113pp.
U.S. Appl. No. 15/703,917, filed Sep. 13, 2017, Abel et al.
U.S. Appl. No. 15/847,744, filed Dec. 19, 2017, Henri et al.
U.S. Notice of Allowance dated Jan. 29, 2018 issued in U.S. Appl. No. 15/650,662.
U.S. Notice of Allowance dated Feb. 14, 2018 issued in U.S. Appl. No. 14/194,549.
U.S. Notice of Allowance dated Mar. 9, 2018 issued in U.S. Appl. No. 15/609,864.
U.S. Office Action dated Jan. 26, 2018 issued in U.S. Appl. No. 15/683,397.
Taiwan First Office Action dated Mar. 14, 2018 issued in Application No. TW 106122777.
Chinese Third Office Action dated Dec. 22, 2017, issued in Application No. CN 201380006994.1.
U.S. Preliminary Amendment dated Feb. 1, 2018 filed in U.S. Appl. No. 15/847,744.

* cited by examiner

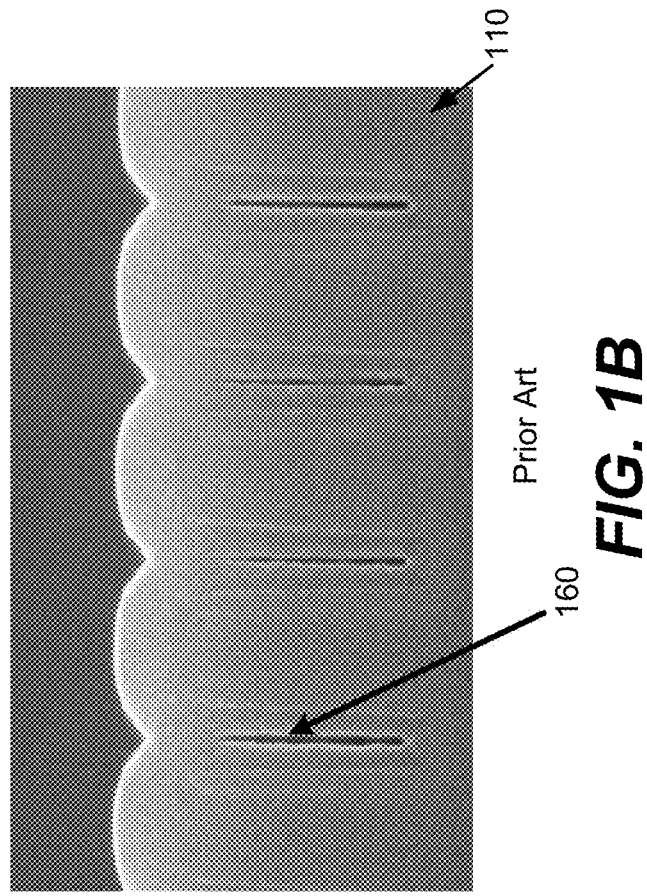
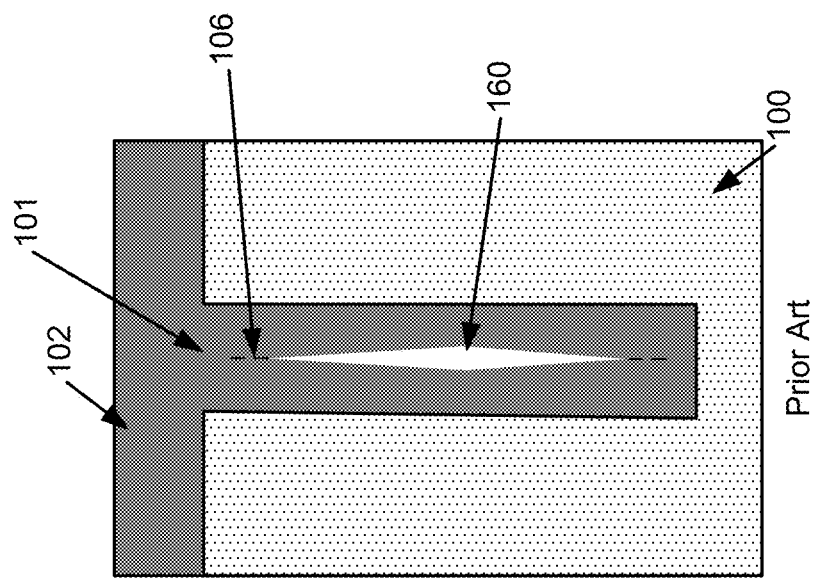

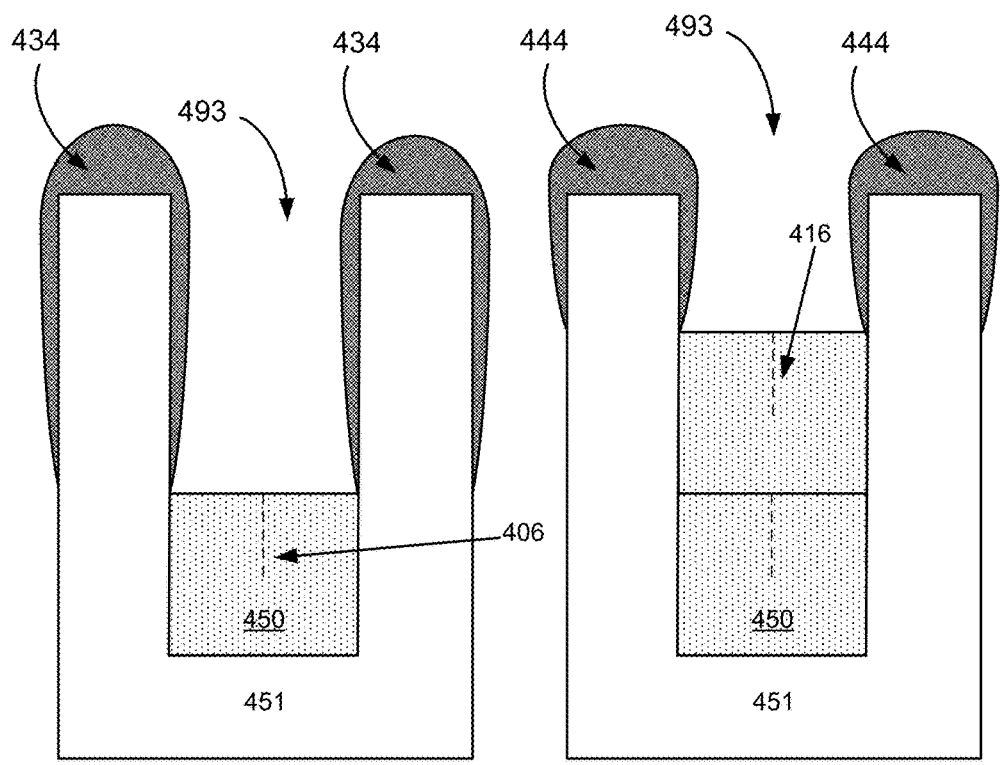
*FIG. 4E*  *FIG. 4F*

SELECTIVE ATOMIC LAYER DEPOSITION FOR GAPFILL USING SACRIFICIAL UNDERLAYER

BACKGROUND

Fabrication of devices such as semiconductor devices may involve deposition of various dielectric, conductive, or semiconductive films in or over raised or recessed features on a substrate. Deposition of films that are conformal to the underlying topography of a substrate can be challenging, particularly with an increase in aspect ratios and decrease in critical dimensions of features.

SUMMARY

Provided herein are methods of processing substrates. One aspect involves a method of processing a substrate having one or more features, the method including: (a) receiving the substrate having a sacrificial layer deposited over the one or features, whereby the thickness of the sacrificial layer near the top of the one or more features is greater than the thickness of the sacrificial layer near the bottom of the one or more features, and whereby there is substantially no deposition of the sacrificial layer at the bottom of the one or more features; (b) exposing the substrate comprising the sacrificial layer to a precursor for a duration sufficient to adsorb the precursor on the one or more features; and (c) after exposing the substrate to the precursor, etching the sacrificial layer to remove adsorbed precursor from the top of the one or more features while leaving adsorbed precursor at the bottoms of the one or more features.

In various embodiments, the method also includes (d) exposing the substrate to a second reactant reactive with the adsorbed precursor to preferentially deposit a film on sidewalls and the bottoms of the one or more features. In some embodiments, the substrate is exposed to the second reactant after etching the sacrificial layer. In some embodiments, (d) further includes igniting a plasma.

In some embodiments, the film is selected from the group consisting of silicon oxides, boron doped silicon oxides, phosphorus doped silicon oxides, silicon, poly-silicon, silicon carbides, and silicon nitrides. In some embodiments, the film includes silicon oxide.

In some embodiments, the method also includes (e) depositing a second sacrificial layer over the one or more features, whereby the thickness of the second sacrificial layer near the top of the one or more features is greater than the thickness of the second sacrificial layer near the bottom of the one or more features, and whereby there is substantially no deposition of the second sacrificial layer at the bottom of the one or more features. In various embodiments, the method also includes repeating (b)-(e) in cycles and performing (e) every n cycles, whereby n is an integer greater than or equal to 1. For example, in some embodiments, n is 1 and the second sacrificial layer is deposited to an average thickness of about 10 Å. In some embodiments, n is greater than or equal to 2.

In various embodiments, less than about 50 nm of the sacrificial layer is etched in (c).

In various embodiments, less than about 10 Å of the sacrificial layer is etched in (c).

In various embodiments, the sacrificial layer includes carbon and (c) further includes exposing the substrate to an oxidizing gas to etch the sacrificial layer.

In some embodiments, the sacrificial layer is deposited on the substrate by exposing the substrate to a hydrocarbon precursor and igniting a plasma, the hydrocarbon precursor having the formula $C_XH_Y$, whereby X is an integer between 2 and 10, and Y is an integer between 2 and 24.

In various embodiments, the sacrificial layer is deposited using any one or more of the following techniques: chemical vapor deposition (CVD), plasma-enhanced chemical vapor deposition (PECVD), sputtering, physical vapor deposition (PVD), and spin coating.

In various embodiments, the sacrificial layer includes aluminum and etching the sacrificial layer includes exposing the substrate to a halogen-containing gas.

In various embodiments, the sacrificial layer includes titanium and etching the sacrificial layer includes exposing the substrate to a halogen-containing gas.

In some embodiments, the film is not silicon (Si) nor a silicon oxide ($SiO_x$), and whereby (c) further includes exposing the substrate to a fluorine-containing gas to etch the sacrificial layer.

In various embodiments, etching the sacrificial layer includes exposing the substrate to chlorine.

In various embodiments, etching the sacrificial layer includes exposing the substrate to an oxygen-containing gas and igniting a plasma. In various embodiments, etching the sacrificial layer includes igniting a plasma.

The thickness of the sacrificial layer near the top of the one or more features in (a) may be less than about 1 nm. In some embodiments, the aspect ratio of at least one of the one or more features is at least 2:1.

Another aspect involves an apparatus for processing substrates, the apparatus including: (a) one or more process chambers, each process chamber including a pedestal for holding a substrate having features; (b) at least one outlet for coupling to a vacuum; (c) one or more process gas inlets coupled to one or more precursor sources and one or more oxygen-containing gas sources; (d) a radio frequency (RF) generator; and (e) a controller for controlling operations in the apparatus, including machine-readable instructions for: (i) introducing a precursor from at least one of the one or more precursor sources to a first process chamber to form a sacrificial layer on the substrate; (ii) after forming the sacrificial layer, introducing a silicon-containing precursor to a second process chamber to adsorb the silicon-containing precursor to the substrate; and (iii) introducing an oxygen-containing gas to the second process chamber and igniting a plasma to preferentially form a silicon oxide film over regions of the substrate where the sacrificial layer is not deposited. In some embodiments, the controller further includes machine-readable instructions for transferring the substrate including the sacrificial layer from the first process chamber to the second process chamber.

These and other aspects are described further below with reference to the drawings.

BRIEF DESCRIPTION OF THE DRAWINGS

FIG. 1A is a schematic illustration of a feature in a substrate.

FIG. 1B is an image of features in a substrate.

FIGS. 4E and 4F are schematic illustrations of substrates having material deposited in accordance with certain disclosed embodiments.

DETAILED DESCRIPTION

Figure 2A:
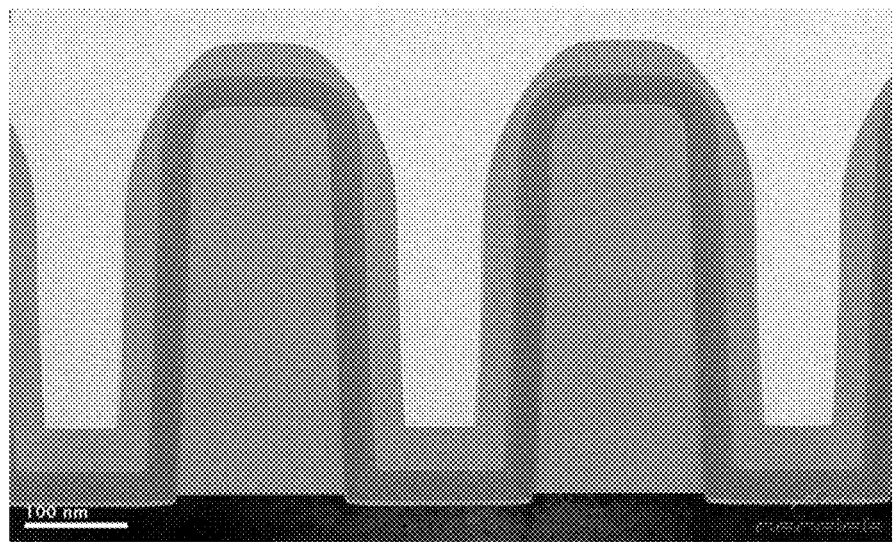
FIGS. 2A and 2B are images of trenches in substrates.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

The implementations disclosed below describe deposition of a material on a substrate such as a wafer, substrate, or other work piece. The work piece may be of various shapes, sizes, and materials. In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. Unless otherwise stated, the processing details recited herein (e.g., flow rates, power levels, etc.) are relevant for processing 300 mm diameter substrates in chambers that are configured to process 300 mm diameter substrates, and can be scaled as appropriate for substrates or chambers of other sizes. In addition to semiconductor wafers, other work pieces that may be used implementations disclosed herein include various articles such as printed circuit boards and the like. The processes and apparatuses can be used in the fabrication of semiconductor devices, displays, LEDs, photovoltaic panels and the like.

Manufacturing processes of semiconductor devices typically involve depositing one or more conformal thin films on a substrate in an integrated fabrication process. For example, some front-end-of-the-line processes may involve deposition of conformal films by atomic layer deposition (ALD). ALD is a technique that deposits thin layers of material using sequential self-limiting reactions. ALD processes use surface-mediated deposition reactions to deposit films on a layer-by-layer basis in cycles. As an example, an ALD cycle may include the following operations: (i) delivery/adsorption of a precursor, (ii) purging of precursor from the chamber, (iii) delivery of a second reactant and optionally ignite plasma, and (iv) purging of byproducts from the chamber. The reaction between the second reactant and the adsorbed precursor to form a film on the surface of a substrate affects the film composition and properties, such as nonuniformity, stress, wet etch rate, dry etch rate, electrical properties (e.g., breakdown voltage and leakage current), etc. In ALD deposition of silicon oxide films, this reaction involves reacting oxygen plasma with carbon and nitrogen to form a gaseous species; oxidizing silicon to silicon oxide; eliminating trace carbon, nitrogen, and hydrogen impurities; and increasing bonding and densification of the film.

Unlike a chemical vapor deposition (CVD) technique, ALD processes use surface-mediated deposition reactions to deposit films on a layer-by-layer basis. In one example of an ALD process, a substrate surface that includes a population of surface active sites is exposed to a gas phase distribution of a first precursor, such as a silicon-containing precursor, in a dose provided to a chamber housing a substrate. Molecules of this first precursor are adsorbed onto the substrate surface, including chemisorbed species and/or physisorbed molecules of the first precursor. It should be understood that when a compound is adsorbed onto the substrate surface as described herein, the adsorbed layer may include the compound as well as derivatives of the compound. For example, an adsorbed layer of a silicon-containing precursor may include the silicon-containing precursor as well as derivatives of the silicon-containing precursor. After a first precursor dose, the chamber is then evacuated to remove most or all of first precursor remaining in gas phase so that mostly or only the adsorbed species remain. In some implementations, the chamber may not be fully evacuated. For example, the reactor may be evacuated such that the partial pressure of the first precursor in gas phase is sufficiently low to mitigate a reaction. A second reactant, such as an oxygen-containing gas, is introduced to the chamber so that some of these molecules react with the first precursor adsorbed on the surface. In some processes, the second precursor reacts immediately with the adsorbed first precursor. In other embodiments, the second reactant reacts only after a source of activation is applied temporally. The chamber may then be evacuated again to remove unbound second reactant molecules. As described above, in some embodiments the chamber may not be completely evacuated. Additional ALD cycles may be used to build film thickness.

In certain embodiments, an ALD first precursor dose partially saturates the substrate surface. In some embodiments, the dose phase of an ALD cycle concludes before the precursor contacts the substrate to evenly saturate the surface. Typically, the precursor flow is turned off or diverted at this point, and only purge gas flows. By operating in this sub-saturation regime, the ALD process reduces the cycle time and increases throughput. However, because precursor adsorption is not saturation limited, the adsorbed precursor concentration may vary slightly across the substrate surface. Examples of ALD processes operating in the sub-saturation regime are provided in U.S. patent application Ser. No. 14/061,587, filed Oct. 23, 2013, titled "SUB-SATURATED ATOMIC LAYER DEPOSITION AND CONFORMAL FILM DEPOSITION," which is incorporated herein by reference in its entirety.

In some implementations, the ALD methods include plasma activation. As described herein, the ALD methods and apparatuses described herein may be conformal film deposition (CFD) methods, which are described generally in U.S. patent application Ser. No. 13/084,399 (now U.S. Pat. No. 8,728,956), filed Apr. 11, 2011, and titled "PLASMA ACTIVATED CONFORMAL FILM DEPOSITION," and in U.S. patent application Ser. No. 13/084,305, filed Apr. 11, 2011, and titled "SILICON NITRIDE FILMS AND METHODS," which are herein incorporated by reference in their entireties.

Films deposited by ALD are typically conformal. Conformality of films may be measured by the step coverage. Step coverage may be calculated by comparing the average thickness of a deposited film on a bottom, sidewall, or top of a trench to the average thickness of a deposited film on a bottom, sidewall, or top of a feature or trench. A "feature" of a substrate may be a via or contact hole, which may be characterized by one or more of narrow and/or re-entrant openings, constrictions within the feature, and a high aspect ratio. The terms "trench" and "feature" may be used interchangeably in the present disclosure and will be understood to include any hole, via, or recessed region of a substrate.

One example of step coverage may be calculated by dividing the average thickness of the deposited film on the sidewall by the average thickness of the deposited film at the top of the feature and multiplying it by 100 to obtain a percentage. Although ALD can deposit highly conformal films, deposition of films into high aspect ratio features becomes challenging. The step coverage and uniformity of film property along the sidewall depends on, among many factors, the transport of the deposition precursor, reactant ions and/or radicals (such as those generated by igniting a reactant gas with a plasma), and by-products. As the dimension of the trench is reduced, the transport becomes increasing difficult in the trench leading to formation of a seam and/or voids in high aspect ratio trenches.

In plasma-enhanced ALD (PEALD) processes, the top of the trenches are exposed to more precursor and reactant species than deeper into the trench. This differential in molecular interactions at the top, sidewall, and bottom of a trench leads to non-uniform properties along the sidewall. For example, in high aspect ratio features, a void and/or a seam may form in the middle of the feature. FIG. 1A shows an example of a substrate 100 having feature or trench 101 filled with silicon oxide 102 by a conventional PEALD technique. A seam 106 forms where the silicon oxide growth from the sidewalls of the feature 101 meet, and a void 160 forms in the center of the feature 101, thereby resulting in incomplete fill of the feature 101. The void 160 may form because the top of the feature 101 is exposed to more precursor and reactant species, thereby forming a thicker layer of material near the tops of the features and closing the feature to form a void 160. As the opening at the top of feature 101 closes with various PEALD deposition cycles, molecular transport becomes progressively difficult, leading to progressive degradation of the ALD film and closing of the trench top, leaving an air-gap or void 160 in the feature. FIG. 1B shows an image of a substrate 110 after exposure to hydrofluoric acid, which causes void 160 to be visible after the etching process.

In addition to the formation of voids and seams, the film deposited within the trench may have a different and more degraded film quality than film deposited near the top of a trench. This may be due to reactant species, such as species generated when a second reactant is ignited by a plasma, being unable to transport into the depths of the trench such that the number and distribution of reactant species reaching the trench bottom is different from the top. The film quality can be evaluated by etching the deposited film in diluted hydrofluoric acid and observing and comparing the amount of film etched at or near the top of the trenches and the amount of film etched along the sidewalls.

Figure 2B:
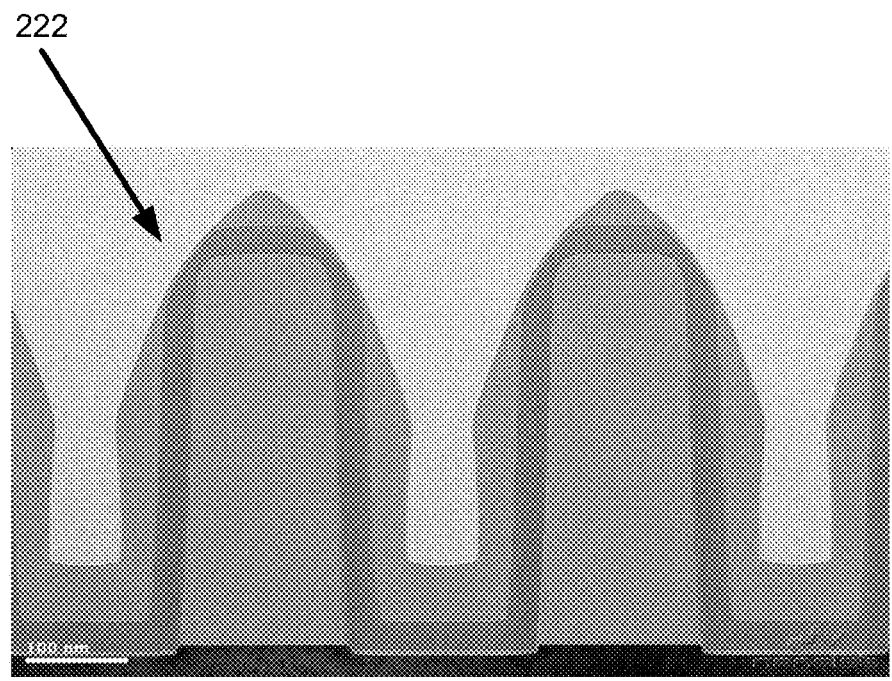

Conventional techniques for increasing exposure time to the second reactant and plasma to allow more reactant species to diffuse into trenches have drawbacks. For example, increasing plasma exposure time or plasma power may lead to densification and/or sputtering at the top of the features and along corners at or near the top of the features. An example is provided in FIGS. 2A and 2B. FIG. 2A shows a substrate with a film deposited using exposures to cycles of 2-second exposures to plasma at 495° C. FIG. 2B shows a substrate with a film deposited using exposures to cycles of 5-second exposures to plasma at 495° C. As shown, the substrate in FIG. 2B has been sputtered at the trench edges 222, resulting in a non-conformal film.

Provided herein are methods and apparatuses for forming conformal films using ALD and deposition of sacrificial layers which are particularly suitable for forming films in high aspect ratio features and for gapfill applications. Disclosed embodiments inhibit deposition at or near the top of features or trenches as the tops of features or trenches include a sacrificial layer such that deposition precursors adsorb onto the sacrificial layer. The sacrificial layer is etched, thereby removing the adsorbed precursor and any deposited film over the sacrificial layer. As the sacrificial layer is selectively formed near the tops of the features to a desirable depth into a feature, the amount of inhibition may be modulated to thereby modulate the amount of deposition in the feature. Deposition and etching of sacrificial layers may be used in initial cycles of depositing a film by ALD or PEALD as described herein to allow bottom-up fill of a feature and prevent the top of the feature from closing. In some embodiments, sacrificial layers may be deposited to a thickness to withstand multiple cycles of ALD or PEALD and after various cycles of ALD or PEALD, a sacrificial layer may be deposited over the substrate again as needed. Disclosed embodiments may be used to partially fill high aspect ratio structures, such as for forming contact liners, and may also be used to completely fill high aspect ratio structures, such as for gapfill applications. Disclosed embodiments may be suitable for depositing silicon-containing material into high aspect ratio features, such as silicon-containing materials including silicon oxide, boron and phosphorus doped silicon oxides, silicon, poly-silicon, silicon carbide, and silicon nitride.

Figure 3:
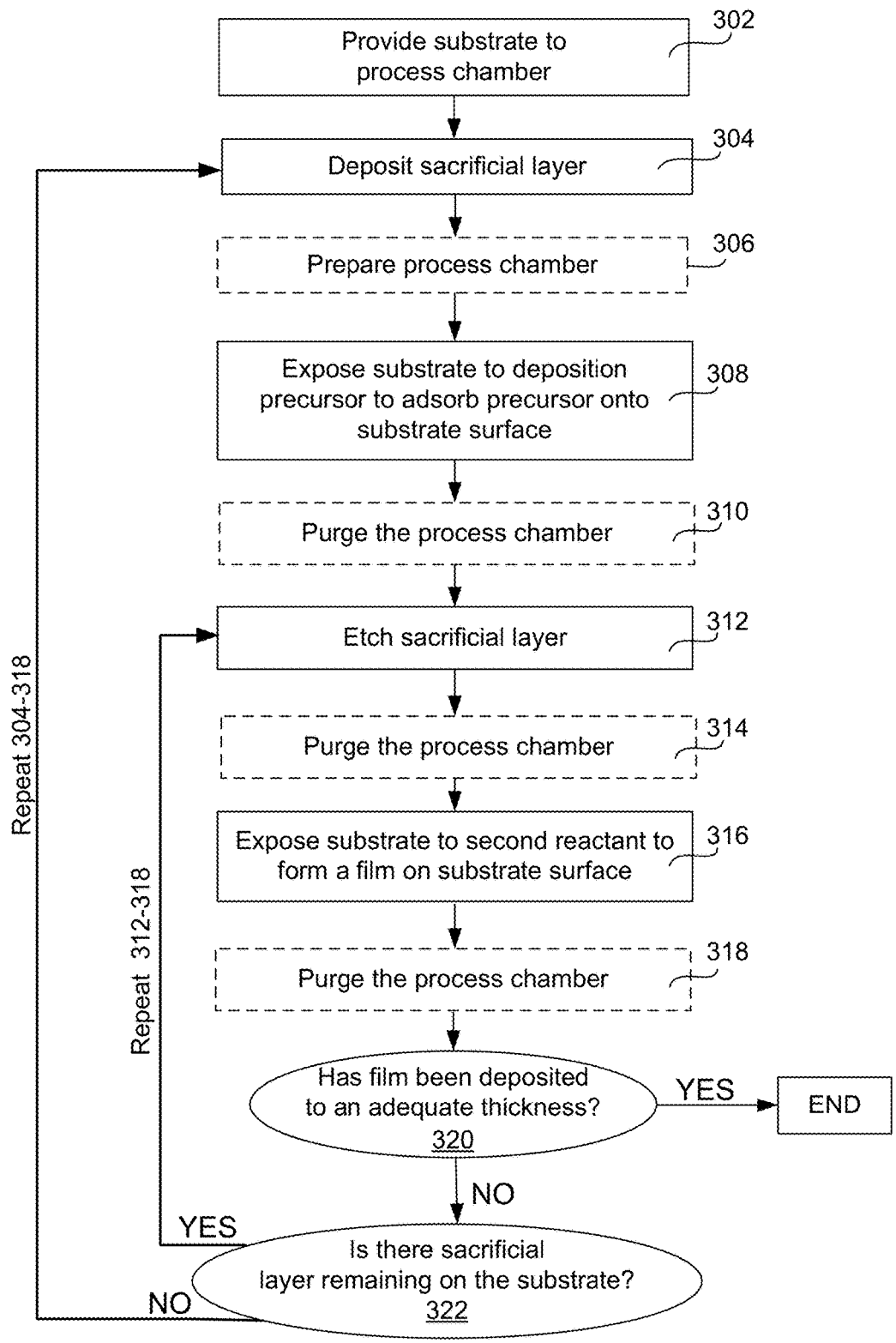
FIG. 3 is a process flow diagram depicting operations for a method performed in accordance with certain disclosed embodiments.

FIG. 3 is a process flow diagram depicting operations for a method performed in accordance with certain disclosed embodiments. Although examples provided herein describe disclosed embodiments in the context of depositing silicon oxide films, it will be understood that methods may also be used to deposit films of any material by ALD.

In operation 302 of FIG. 3, a substrate is provided to a process station of a single station or multi-station chamber. In various embodiments, the substrate is a semiconductor substrate. The substrate may be a silicon wafer, e.g., a 200-mm wafer, a 300-mm wafer, or a 450-mm wafer, including wafers having one or more layers of material, such as dielectric, conducting, or semi-conducting material deposited thereon. Substrates may have "features" such as via or contact holes, which may be characterized by one or more of narrow and/or re-entrant openings, constrictions within the feature, and high aspect ratios. The feature may be formed in one or more of the above described layers. One example of a feature is a hole or via in a semiconductor substrate or a layer on the substrate. Another example is a trench in a substrate or layer. The terms "trench" and "feature" may be used interchangeably in the present disclosure and will be understood to include any hole, via, or recessed region of a substrate. In various embodiments, the feature may have an under-layer, such as a barrier layer or adhesion layer. Non-limiting examples of under-layers include dielectric layers and conducting layers, e.g., silicon oxides, silicon nitrides, silicon carbides, metal oxides, metal nitrides, metal carbides, and metal layers.

In some embodiments, the feature may have an aspect ratio of at least about 2:1, at least about 10:1, at least about 20:1, at least about 40:1, or higher. The feature may also have a dimension near the opening, e.g., an opening diameter or line width of between about 10 nm to 500 nm, for example between about 25 nm and about 300 nm. Disclosed methods may be performed on substrates with features having an opening less than about 150 nm. A via, trench or other recessed feature may be referred to as an unfilled feature or a feature. According to various embodiments, the feature profile may narrow gradually and/or include an overhang at the feature opening. A re-entrant profile is one that narrows from the bottom, closed end, or interior of the feature to the feature opening. A re-entrant profile may be generated by asymmetric etching kinetics during patterning and/or the overhang due to non-conformal film step coverage in the previous film deposition, such as deposition of a diffusion barrier. In various examples, the feature may have a width smaller in the opening at the top of the feature than the width of the bottom of the feature.

During operations 304-318 of FIG. 3, a carrier gas may be flowed. In various embodiments, the carrier gas is an inert gas. In some embodiments, the carrier gas is a non-inert gas. Example carrier gases include but are not limited to argon, helium, oxygen, nitrous oxide, and neon. In some embodiments, the carrier gas is used as a purge gas in some operations. In some embodiments, the carrier gas is diverted. The carrier gas may be provided to assist with pressure and/or temperature control of the process chamber, evaporation of a liquid reactant, more rapid delivery of the reactant and/or as a sweep gas for removing process gases from the process chamber and/or process chamber plumbing.

Various disclosed embodiments may be performed at a pressure between about 0.1 Torr and about 20 Torr. In many embodiments, the methods disclosed may be performed at a substrate temperature less than about 650° C., or less than about 450° C., or between about 25° C. and about 650° C., such as about 200° C. In such embodiments, the pedestal may be set to a temperature of less than about 450° C. In some embodiments, the method is performed at a higher temperature, such as greater than about 250° C., or greater than about 450° C.

In some embodiments, operation 302 and 304 may be performed together such that a substrate having a sacrificial layer deposited thereon is provided to the process chamber. In operation 304, a sacrificial layer is deposited non-conformally such that there is little or no deposition at the bottom surface and a portion of the sidewall near the bottom. In various embodiments, the sacrificial layer is deposited such that there is substantially no deposition of the sacrificial layer at the bottoms of the features. It will be understood that "substantially no deposition" may include some embodiments where a thin amount of a sacrificial layer is deposited at the bottom of the features and embodiments where no sacrificial layer is deposited at the bottom of the features. A thin amount may be less than about 1 Å in thickness in various embodiments. In some embodiments, a thin amount of sacrificial layer at the bottom of the features is not continuous. Accordingly, "substantially no deposition" refers to deposition of up to, but no greater than, about 1 Å of average thickness at the bottom of the feature.

The thickness of the sacrificial layer deposited near the top of the feature may be greater than the thickness of the sacrificial layer deposited deeper within the features. The deposition profile of the sacrificial layer depends on the dimension of the opening of the trench or hole, and the aspect ratio of the feature. "Near the top" of a feature can be defined as any region in the top 10% to 90% of the depth of the feature. In some embodiments, depending on the application, a small, thin amount of sacrificial layer may be deposited in the bottom of the features, such as in circumstances in which a small amount of carbon does not affect the function and purpose of the filled feature. For example, where the feature is filled in a gapfill application and the interface at the bottom of the feature can tolerate some decrease in electrical quality, the feature can tolerate some deposition of a sacrificial layer at the bottom of the features. However, it will be understood that in many embodiments, where high quality electrical properties at the interface of the bottom of the features are desired, such as in applications where current leakage is minimized, there is no deposition of a sacrificial layer at the bottom of the features.

It will be understood that the term "sacrificial layer" as used herein includes one or more layers of material. In various embodiments, as described above, there is substantially no deposition of a sacrificial layer at the bottom of a feature such that deposition of the sacrificial layer over a feature results in a noncontinuous layer of material deposited over surfaces of the feature. Sacrificial layers may be deposited such that the thickness near the top of the feature is between about 2 Å and about 50 nm. In some embodiments, the sacrificial layer deposited near the opening of a feature may be deposited to a thickness of at most about 40% of the feature opening size. For example, the opening size of the feature (e.g., width of the feature opening) after the sacrificial layer is deposited over the tops of the features may be about 20% of the original size of the feature opening before depositing the sacrificial layer. In some embodiments, the thickness of the sacrificial layer near the top of the feature is about 10 Å. The sacrificial layer is deposited such that the thickness of the sacrificial layer does not hinder or prevent diffusion of deposition precursors or reactant species such as plasma species into the features.

The sacrificial layer may be deposited by any non-ALD technique, such as chemical vapor deposition (CVD), plasma-enhanced chemical vapor deposition (PECVD), sputtering, physical vapor deposition (PVD) or other liquid processing techniques e.g. spin coating. The deposition technique selected may be a line-of-sight deposition technique that provides very low growth on the sidewalls and on the bottom of features. These non-conformal processes can be used to deposit the sacrificial layer at or near the top of the features. Generally, the sacrificial layer may be a film that forms a gas when reacted with an etchant or the reactant used to convert an adsorbed precursor layer to a film as further described below. The sacrificial layer may be an etchable material, or may be a material that can be made volatile using various techniques.

In various embodiments, the sacrificial layer may be a carbon-containing material. In some embodiments, the sacrificial layer is a material that, when reacted with an oxygen-containing plasma, is etched or made volatile. Example sacrificial layers include ashable hard masks, amorphous carbon, and diamond-like carbon deposited using vacuum-based techniques, Spin On Carbon (SOC), and photoresist deposited using liquid processing techniques. For example, in some embodiments, the sacrificial layer may be deposited by exposing the substrate to a hydrocarbon precursor, which is defined as a precursor having the formula $C_XH_Y$, whereby X is an integer between 2 and 10, and Y is an integer between 2 and 24. Examples include methane ($CH_4$), acetylene ($C_2H_2$), ethylene ($C_2H_4$), propylene ($C_3H_6$), butane ($C_4H_{10}$), cyclohexane ($C_6H_{12}$), benzene ($C_6H_6$), and toluene ($C_7H_8$). In some embodiments, two or more hydrocarbon precursors may be used. Deposition of a sacrificial layer may also be performed using a plasma. In some embodiments, the substrate is exposed to a hydrocarbon precursor and a plasma is ignited to form a carbon-containing sacrificial layer at or near the top of the features or trenches. In some embodiments, the carbon-containing sacrificial layer may be deposited by igniting plasma using a dual RF plasma source that includes a low frequency (LF) component and a high frequency (HF) component. In some embodiments, the methods of the embodiments use LF RF power to generate high energy ion bombardment. Low frequency RF power refers to an RF power having a frequency between about 100 kHz and about 1 MHz typically 400 KHz. In some embodiments, pulsing frequency may be limited by the operation capability of the LF generator. In some embodiments, LF RF power has an RF power with a frequency of about 400 kHz. During deposition, in some embodiments, the LF power ranges between about 0.1 W/cm$^2$ and about 2.5 W/cm$^2$, as expressed in W per cm$^2$ of substrate surface area. In some embodiments, the LF power ranges between about 0.5 W/cm$^2$ and about 1.5 W/cm$^2$. High frequency RF power refers to an RF power having a frequency between about 2 MHz and about 60 MHz. In some embodiments, HF RF power has an RF power with a frequency of about 13.56 MHz. During deposition, in some embodiments, the HF power per substrate area ranges between about 0.1 W/cm$^2$ and about 2.5 W/cm$^2$. In some embodiments, the HF power per substrate area ranges between about 0.5 W/cm$^2$ to about 1.5 W/cm$^2$.

In various embodiments, the sacrificial layer is aluminum or aluminum oxide ($Al_2O_3$), which can react with a halogen-containing gas to remove the sacrificial layer. For example, in some embodiments, the sacrificial layer may be exposed to chlorine to form aluminum trichloride that can be removed in later operations. In various embodiments, the sacrificial layer is titanium or titanium oxide, which can react with a halogen-containing gas to remove the sacrificial layer. For example, in some embodiments, the sacrificial layer may be exposed to form titanium chloride to remove the sacrificial layer in later operations. One example halogen-containing gas is chlorine.

Figure 4A:
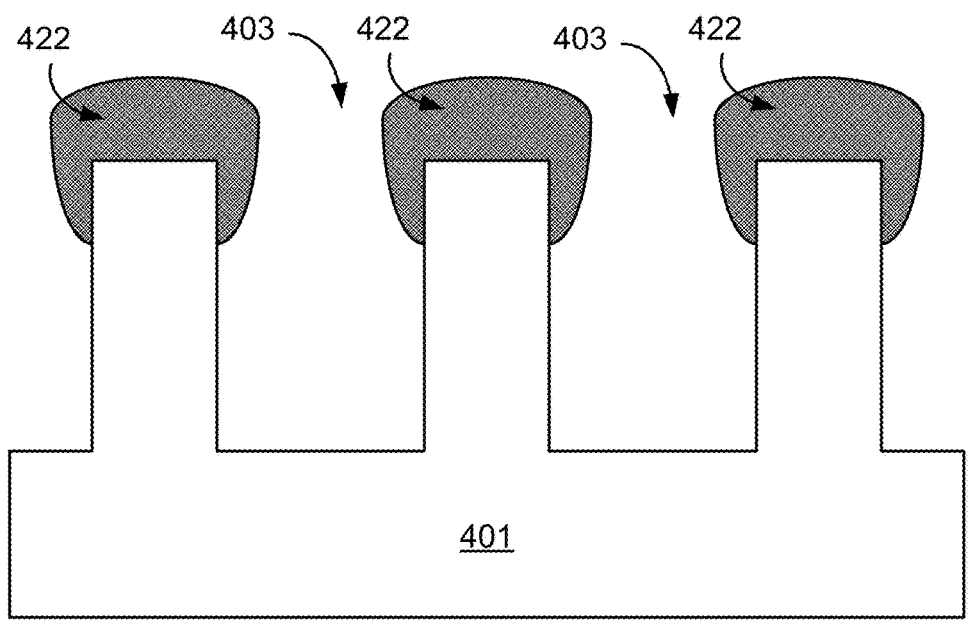
FIGS. 4A-4D are schematic illustrations of substrates during operations performed in accordance with certain disclosed embodiments.

FIG. 4A shows an example substrate 401 including patterned trenches 403 where sacrificial layers 422 are deposited at or near the top of the features 403.

Returning to FIG. 3, in operation 306, the chamber is prepared. In some embodiments, operation 306 involves receiving a substrate having a sacrificial layer deposited thereon in a process chamber. In some embodiments, this operation involves moving the substrate from a chamber used to deposit the sacrificial layer to another chamber for depositing the desired film such as silicon oxide. In some embodiments where the sacrificial layer is deposited in the same chamber as the silicon oxide, this operation involves optionally purging the chamber. Purging the chamber may involve flowing a purge gas or a sweep gas, which may be a carrier gas used in other operations or may be a different gas. In some embodiments, purging may involve evacuating the chamber. Example purge gases include argon, nitrogen, hydrogen, and helium. In some embodiments, operation 306 may include one or more evacuation subphases for evacuating the process chamber. Alternatively, it will be appreciated that operation 306 may be omitted in some embodiments. Operation 306 may have any suitable duration, such as between about 0 seconds and about 60 seconds, for example about 0.01 seconds. In some embodiments, increasing a flow rate of a one or more purge gases may decrease the duration of operation 306. For example, a purge gas flow rate may be adjusted according to various reactant thermodynamic characteristics and/or geometric characteristics of the process chamber and/or process chamber plumbing for modifying the duration of operation 306. In one non-limiting example, the duration of a purge phase may be adjusted by modulating purge gas flow rate. This may reduce deposition cycle time, which may improve substrate throughput. After a purge, the silicon-containing precursors remain adsorbed onto the substrate surface.

In operation 308, the substrate exposed to a deposition precursor such that the deposition precursor is adsorbed onto the substrate surface to form an adsorbed layer. In some embodiments, the deposition precursor may adsorb onto the sacrificial layer. In some embodiments, the deposition precursor may not adsorb onto the sacrificial layer. For example, in some embodiments, the deposition precursor adsorbs onto surfaces of the substrate that do not include the sacrificial layer but does not necessarily adsorb onto the sacrificial layer.

The deposition precursor may be a silicon-containing precursor in some embodiments. In some embodiments, a deposition precursor adsorbs onto the substrate surface in non-sacrificial layer surfaces in a self-limiting manner such that once active sites are occupied by the deposition precursor, little or no additional deposition precursor will be adsorbed on the substrate surface. For example, deposition precursors may be adsorbed onto about 60% of the substrate surface. In some embodiments, the deposition precursor also adsorbs onto the sacrificial layer in a self-limiting manner.

In various embodiments, when the deposition precursor is flowed to the chamber, the deposition precursor adsorbs onto active sites on the surface of the substrate, forming a thin layer of the deposition precursor on the surface. In various embodiments, this layer may be less than a monolayer, and may have a thickness between about 0.2 Å and about 3.0 Å. At process temperatures greater than about 450° C., some silicon-containing precursors may decompose to form a layer of silicon.

Where a silicon-containing film is deposited, such as silicon oxide or silicon nitride, various suitable silicon-containing precursors may be used. A silicon-containing precursor is a single reagent or mixture of reagents used to make a silicon-containing film, where the reagent or reagent mixture contains at least one silicon compound. In some embodiments, the silicon-containing precursor may be, for example, a silane, a halosilane, or an aminosilane.

Silicon-containing precursors suitable for use in accordance with disclosed embodiments include polysilanes ($H_3Si$—$(SiH_2)_n$—$SiH_3$), where n≥0. Examples of silanes are silane ($SiH_4$), disilane ($Si_2H_6$), and organosilanes such as methylsilane, ethylsilane, isopropylsilane, t-butylsilane, dimethylsilane, diethylsilane, di-t-butylsilane, allylsilane, sec-butylsilane, thexylsilane, isoamylsilane, t-butyldisilane, di-t-butyldisilane, and the like.

A halosilane includes at least one halogen group and may or may not include hydrogens and/or carbon groups. Examples of halosilanes are iodosilanes, bromosilanes, chlorosilanes, and fluorosilanes. Although halosilanes, particularly fluorosilanes, may form reactive halide species that can etch silicon materials when a plasma is struck, a halosilane may not be introduced to the chamber when a plasma is struck in some embodiments, so formation of a reactive halide species from a halosilane may be mitigated. Specific chlorosilanes are tetrachlorosilane, trichlorosilane, dichlorosilane, monochlorosilane, chloroallylsilane, chloromethylsilane, dichloromethylsilane, chlorodimethylsilane, chloroethylsilane, t-butylchlorosilane, di-t-butylchlorosilane, chloroisopropylsilane, chloro-sec-butylsilane, t-butyldimethylchlorosilane, thexyldimethylchlorosilane, and the like.

An aminosilane includes at least one nitrogen atom bonded to a silicon atom, but may also contain hydrogens, oxygens, halogens, and carbons. Examples of aminosilanes are mono-, di-, tri- and tetra-aminosilane ($H_3Si(NH_2)$, $H_2Si(NH_2)_2$, $HSi(NH_2)_3$ and $Si(NH_2)_4$, respectively), as well as substituted mono-, di-, tri- and tetra-aminosilanes, for example, t-butylaminosilane, methylaminosilane, tert-butylsilanamine, bi(tertiarybutylamino)silane ($SiH_2(NHC(CH_3)_3)_2$ (BTBAS), tert-butyl silylcarbamate, $SiH(CH_3)$—$(N(CH_3)_2)_2$, $SiHCl$—$(N(CH_3)_2)_2$, $(Si(CH_3)_2NH)_3$ and the like. A further example of an aminosilane is trisilylamine ($N(SiH_3)$).

Figure 4B:
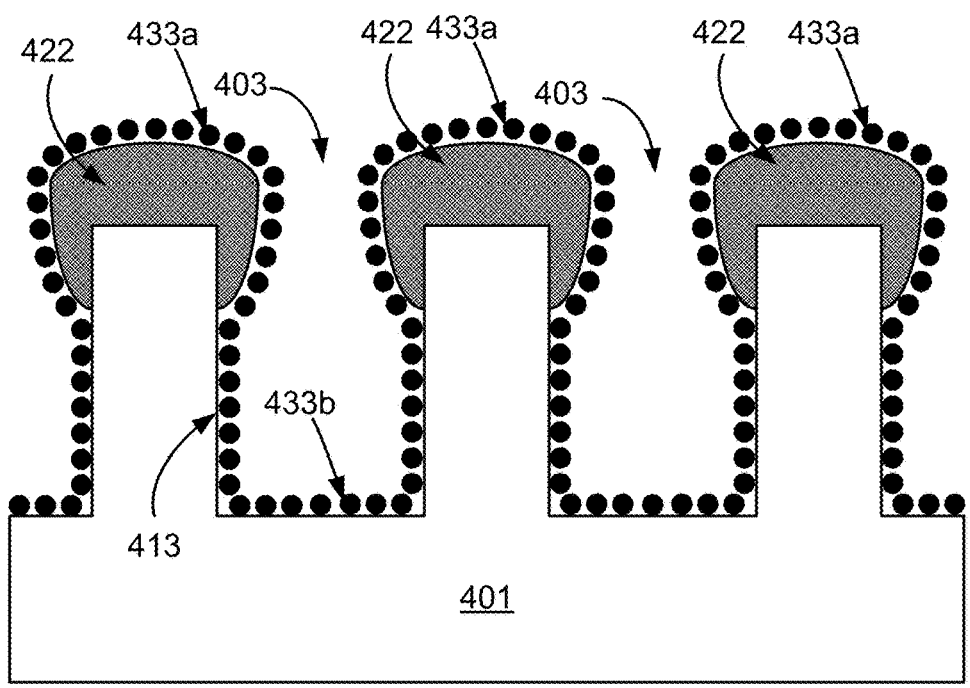

FIG. 4B shows an example substrate 401 including features 403 with deposited sacrificial layers 422. The substrate 401 is exposed to a deposition precursor (shown at 433a and 433b), which conformally adsorbs to the sacrificial layer (433a) and also adsorbs to the bottom of the feature 433b and at the sidewalls 413 of the features.

Returning to FIG. 3, in operation 310, the process chamber is optionally purged to remove excess deposition precursor in gas phase that did not adsorb onto the surface of the substrate. Purging may involve any of the processes and process conditions described above with respect to operation 306.

In operation 312, the sacrificial layer is etched. In some embodiments, operation 312 is performed to remove one or more layers of the sacrificial layer. It will be understood that in some embodiments, a sacrificial layer deposited in operation 304 may have a thickness such that after operation 312, some sacrificial layer remains on the substrate. In some embodiments, the sacrificial layer is etched for a duration sufficient only to remove the adsorbed layer of precursor on the sacrificial layer, without completely removing the entirety of the sacrificial layer. In some embodiments, the sacrificial layer is etched to remove up to the total thickness of the deposited sacrificial layer, or may be etched to remove less than about 50 nm of the sacrificial layer, or may be etched to remove less than about 10 Å of the sacrificial layer, or may be etched to remove less than about 5 Å of the sacrificial layer. The substrate including the sacrificial layer and adsorbed precursor is exposed to a gas and an optional plasma to etch or volatilize the sacrificial layer. For example, where the sacrificial layer is a carbon-containing material, the substrate may be exposed to an oxygen-containing gas such as oxygen ($O_2$) while igniting a plasma. In some embodiments, the substrate may be exposed to a halogen-containing gas, such as chlorine ($Cl_2$) or fluorine ($F_2$) to etch the sacrificial layer. It will be understood that for depositing a silicon film or silicon oxide film, a fluorine-containing gas cannot be used for etching the sacrificial layer as it may also etch any deposited film on the substrate. In some embodiments, the sacrificial layer is etched selective to any deposited film or substrate material exposed on the surface of the substrate so as to only etch or remove regions of the sacrificial layer and the adsorbed precursor overlying the sacrificial layer. It is believed that exposing the sacrificial layer to a gas to remove the sacrificial layer in this operation essentially allows the gas to penetrate the adsorbed precursor layer and remove the sacrificial layer, thereby removing both the sacrificial layer and the precursor adsorbed to it. In some embodiments, even if some silicon-containing precursor is converted to silicon oxide, the sacrificial layer is removed and therefore, the converted silicon oxide is removed from the sacrificial layer and is pumped away or removed. In some embodiments, when the sacrificial layer is etched, any silicon oxide that was formed on the sacrificial layer is converted to gas phase and removed.

In some embodiments, operation 312 is combined with operation 316 as described below. For example, in some embodiments, where an oxygen-containing plasma is used in operation 316 and the sacrificial layer may be etched by exposing to an oxygen-containing plasma, operations 312 and 316 are combined into one operation (and operation 314 is omitted) such that the substrate including the sacrificial layer and adsorbed layer of precursor are exposed to an oxygen-containing plasma to both etch the sacrificial layer and form a silicon oxide film on the substrate. Further description of operation 316 is provided below.

Figure 4C:
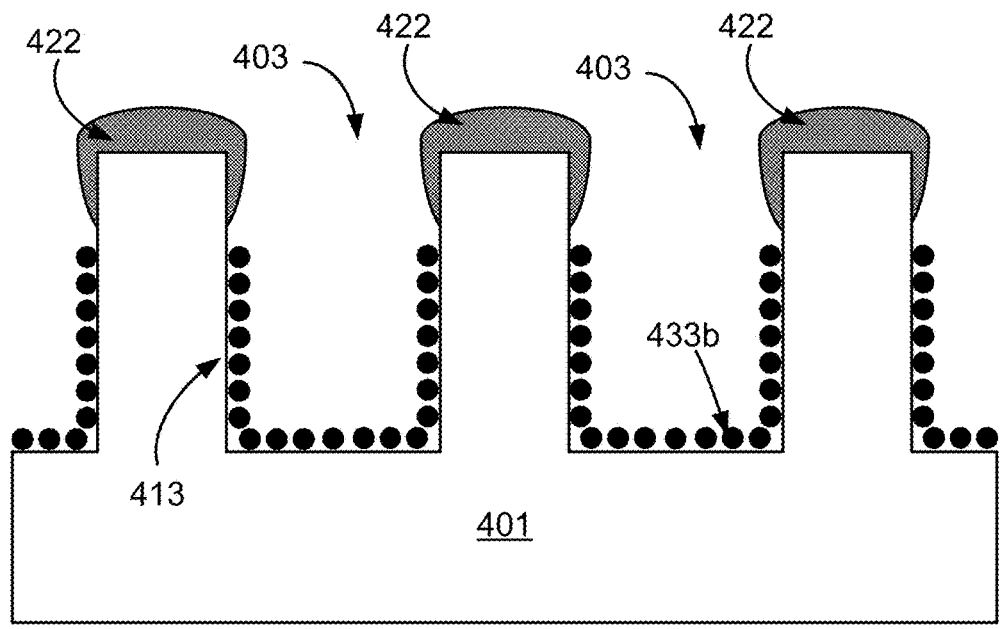

FIG. 4C shows an example substrate 401 having features 403 where the sacrificial layers 422 have been etched and are now smaller and thinner than prior to etching. Note that the adsorbed precursor previously adsorbed onto the surface of the sacrificial layer shown in FIG. 4B is removed in FIG. 4C, while the adsorbed precursor 433b remains at the bottom of the trenches and on the sidewalls 413.

Returning to FIG. 3, in operation 314, the process chamber is optionally purged to remove gaseous reaction products from etching the sacrificial layer and precursor molecules that were previously adsorbed to the sacrificial layer. Purging may involve any of the processes and process conditions described above with respect to operation 306.

In operation 316, the substrate is exposed to a second reactant and a plasma is ignited. The second reactant flow and plasma may be turned on at the same time in various embodiments. In some embodiments, the second reactant flow may be turned on prior to turning on the plasma, for example, to allow the second reactant flow to stabilize. In various embodiments, the second reactant is an oxygen-containing reactant or oxidant, to form at least a partial silicon oxide film on the surface of the substrate.

Example oxygen-containing reactants or oxidants include a mixture of oxygen and a weak oxidizer such as nitrous oxide, carbon monoxide, carbon dioxide, nitric oxide, nitrogen dioxide, sulfur oxide, sulfur dioxide, oxygen-containing hydrocarbons (e.g., $C_xH_yO_z$) and/or water. In other implementations, the oxidation reactant may be entirely weak oxidizer. Alternatively, the oxidation reactant may include ozone.

For deposition of other silicon-containing materials, other reactants may be used as the second reactant to deposit films of different materials. For example, for deposition of a silicon carbide film using disclosed embodiments, the second reactant may be a carbon-containing reactant. For example, for deposition of silicon nitride, a nitrogen-containing reactant may be used. A nitrogen-containing reactant is a reactant or mixture of reactants that includes at least one nitrogen, for example, ammonia, hydrazine, amines (amines bearing carbon) such as methylamine, dimethylamine, ethylamine, isopropylamine, t-butylamine, di-t-butylamine, cyclopropylamine, sec-butylamine, cyclobutylamine, iso-amylamine, 2-methylbutan-2-amine, trimethylamine, diisopropylamine, diethylisopropylamine, di-t-butylhydrazine, as well as aromatic containing amines such as anilines, pyridines, and benzylamines. Amines may be primary, secondary, tertiary, or quaternary (for example, tetraalkylammonium compounds). A nitrogen-containing reactant can contain heteroatoms other than nitrogen, for example, hydroxylamine, t-butyloxycarbonyl amine, and N-t-butyl hydroxylamine are nitrogen-containing reactants. Example nitrogen-containing reactants include nitrogen gas, ammonia, and amines. For deposition of a doped film, a dopant may also be added as a second reactant. For example, for depositing a boron-doped silicon oxide film, a boron precursor may be used, such as TMB (trimethylborate), TEB (triethylborate), $B_2H_6$ (diborane), trimethylborane, triethylborane, and catechol-borane. For depositing a phosphorous-doped silicon oxide film, a phosphorous precursor may be used, such as triethyl phosphate (TEPO) (PO(OC$_2$H$_5$)$_3$); trimethyl phosphate (TMPO) (PO(OCH$_3$)$_3$); trimethyl phosphite (TMPi) (P(OCH$_3$)$_3$); trisdimethylaminophosphorus (TDMAP) (((CH$_3$)$_2$N)$_3$P); phosphorous trichloride (PCl$_3$); trismethylsilyl phosphine (TMSP) (P(Si(CH$_3$)$_3$)$_3$); and phosphorus oxychloride (POCl$_3$). Note that the term "second reactant" may be used to describe one or more gases introduced to the chamber when plasma is ignited in an ALD cycle.

In various embodiments, during operation 316, plasma energy is provided to activate the second reactant, such as an oxygen-containing gas, into ions and radicals and other activated species, which react with the adsorbed layer of the first precursor. For example, the plasma may directly or indirectly activate the oxygen-containing gas phase molecules to form oxygen radicals or ions. Conditions of the chamber may be monitored such that sufficient plasma species can diffuse into trenches and tailor the feature profile and improve conformality within features and trenches.

In various embodiments, the plasma is an in-situ plasma, such that the plasma is formed directly above the substrate surface in the chamber. The in-situ plasma may be ignited at a power per substrate area between about 0.2 W/cm$^2$ and about 2.1 W/cm$^2$. For example, the power may range from about 150 W to about 6000 W, or from about 600 W to about 6000 W, or from about 800 W to about 4000 W, for a chamber processing four 300 mm wafers. For example, plasmas for ALD processes may be generated by applying a radio frequency (RF) field to a gas using two capacitively coupled plates. Ionization of the gas between plates by the RF field ignites the plasma, creating free electrons in the plasma discharge region. These electrons are accelerated by the RF field and may collide with gas phase reactant molecules. Collision of these electrons with reactant molecules may form radical species that participate in the deposition process. It will be appreciated that the RF field may be coupled via any suitable electrodes. In various embodiments, a high frequency plasma is used having a frequency of at least about 13.56 MHz, or at least about 27 MHz, or at least about 40 MHz, or at least about 60 MHz. In some embodiments, a microwave-based plasma may be used. Non-limiting examples of electrodes include process gas distribution showerheads and substrate support pedestals. It will be appreciated that plasmas for ALD processes may be formed by one or more suitable methods other than capacitive coupling of an RF field to a gas. In some embodiments, the plasma is a remote plasma, such that a second reactant is ignited in a remote plasma generator upstream of the chamber, then delivered to the chamber where the substrate is housed.

Process conditions are carefully designed to obtain conformal films by depositing and etching sacrificial layers to modulate the amount of precursor adsorbed in each ALD cycle. Depending on the sacrificial layer deposition technique, suitable deposition condition will have to be selected to deposit predominantly at the top of the surface. Similarly, a suitable etch condition has to be selected to remove the adsorbed precursor along with a portion of sacrificial layer. The suitable etch condition will include temperature, RF power, RF time and flow of reactants used to etch sacrificial layer. For example, in some embodiments, after multiple repetitions of cycles, the sacrificial layer may be completely etched and deposition cycles may be performed without the sacrificial layer to achieve an overall conformal film. In certain embodiments, the sacrificial layer may have to be deposited again where as in some embodiments sacrificial layer will be deposited and etched within each ALD cycle.

Figure 4D:
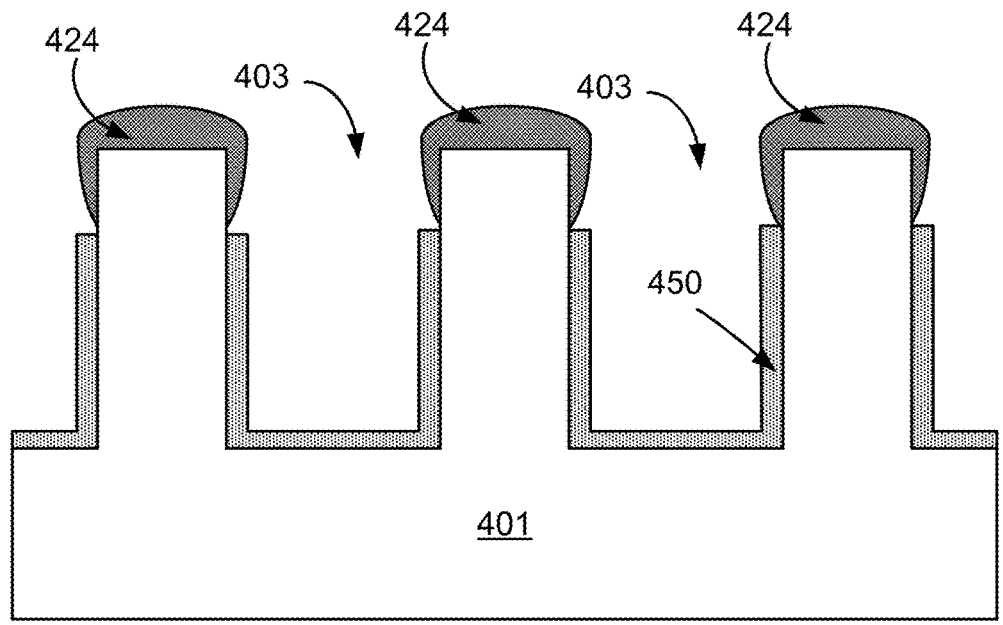

FIG. 4D shows an example substrate 401 with trenches 403 whereby the substrate has been exposed a second reactant with a plasma and the previously adsorbed layer of precursor has been reacted and converted to form a film 450 on the substrate, where the film 450 is preferentially deposited along the sidewalls and the bottom of the trenches, while little to no deposition of the film is formed over the sacrificial layer 424.

Returning to FIG. 3, in operation 318, the process chamber is optionally purged to remove any residual byproducts. Purging may involve any of the processes and process conditions described above with respect to operation 306.

In operation 320 of FIG. 3, it is determined whether the desired thickness of film has been deposited. If not, it is determined in operation 322 if there is sacrificial layer remaining on the substrate. It will be understood that even if some sacrificial layer is etched in operation 312, there may be some sacrificial layer remaining on the substrate in a sufficient thickness to be used for another cycle of operations 304-318. If there is no sacrificial layer remaining on the substrate, operations 304-318 may be repeated to deposit another sacrificial layer on the substrate for use in subsequent cycles.

Any suitable number of deposition cycles may be included in an ALD process to deposit a desired film thickness of the desired film. In various embodiments, operations may be repeated for n cycles, where n is an integer greater than or equal to 1. Any combination of repeating operations 312-318 and 304-318 may be used for a process. For example, in some embodiments, a thick sacrificial layer may be deposited in operation 304, and operations 306-318 may be performed for one cycle, followed by repeated cycles of operations 312-318, then followed by a cycle of operations 304-318, and followed by further repeated cycles of operations 312-318, and so on. As noted above, deposition of the sacrificial layer in operation 304 may not be performed in every cycle. Further, in some embodiments, etching of the sacrificial layer in 312 may also not be performed in every cycle. For example, in some embodiments, after various cycles of deposition, the aspect ratio of the feature is decreased and the sacrificial layer may not be necessary to ensure void-free deposition, so the sacrificial layer may be etched in a prior cycle to be completely removed, and no further sacrificial layer may be deposited such that the feature is subsequently filled using operations 308, 310, 316, and 318.

In subsequent repeated cycles as the trench depth decreases, the amount and type of sacrificial layer deposited may be modified. For example, the thickness of the sacrificial layer deposited may be reduced where the trench depth has decreased due to prior cycles of deposition.

The frequency of performing operation 304 and 312 to deposit and etch sacrificial layers may depend on the size of the trench and the amount of film to be deposited in the trench. In various embodiments, a sacrificial layer is deposited in every 1 to every 50 cycles of ALD. In some embodiments, a sacrificial layer may be deposited and used for more than one cycle depending on the thickness of the sacrificial layer and the amount of film to be deposited in the trench. It will be understood that in some embodiments, different compositions of sacrificial layers may be used over one or more cycles.

Disclosed embodiments may also be used to selectively prevent growth from one particular area of a substrate. For example, where deposition is to be inhibited in one region of the substrate, a sacrificial layer may be deposited over the region to prevent deposition over that region. The sacrificial layer may be subsequently removed in later operations.

Disclosed embodiments may be suitable for burying a seam to avoid exposure of a seam to an etchant. For example, a substrate including a trench may be exposed to multiple cycles of disclosed embodiments may be used to fill the trench such that the trench is not filled to the top to be level with the field of the substrate but rather includes a depth at or near the top of the features that is not deposited with material. Although a seam may form in the middle of the trench, the sacrificial layer and any mask material may be removed and material such as oxide may be deposited over the substrate to fill the rest of the trench. Subsequently, the substrate may be planarized by a technique such as chemical mechanical planarization such that the seam is buried within the trench and will not be exposed to etchants in subsequent operations.

In another example, the thickness of the sacrificial layer deposited over the substrate may be modulated to reduce the length of seams at the middle of trenches. For example, a sacrificial layer 434 may be deposited as shown in FIG. 4E such that the sacrificial layer 434 leaves a shorter seam 406 within the trench 493. FIG. 4F shows silicon oxide 450 deposited within the trench 493 of substrate 451, where the silicon oxide 450 has a short seam 406. The sacrificial layer 434 may then be removed and a second sacrificial layer 444 may be used as the trench depth is reduced as shown in FIG. 4F. Seam 416 is also a shorter seam as shown, and these deposition techniques may be used to improve film quality and consistency of quality throughout the material deposited within the trench. Multiple cycles using various sacrificial layers may be performed to form shorter seams.

Figure 5:
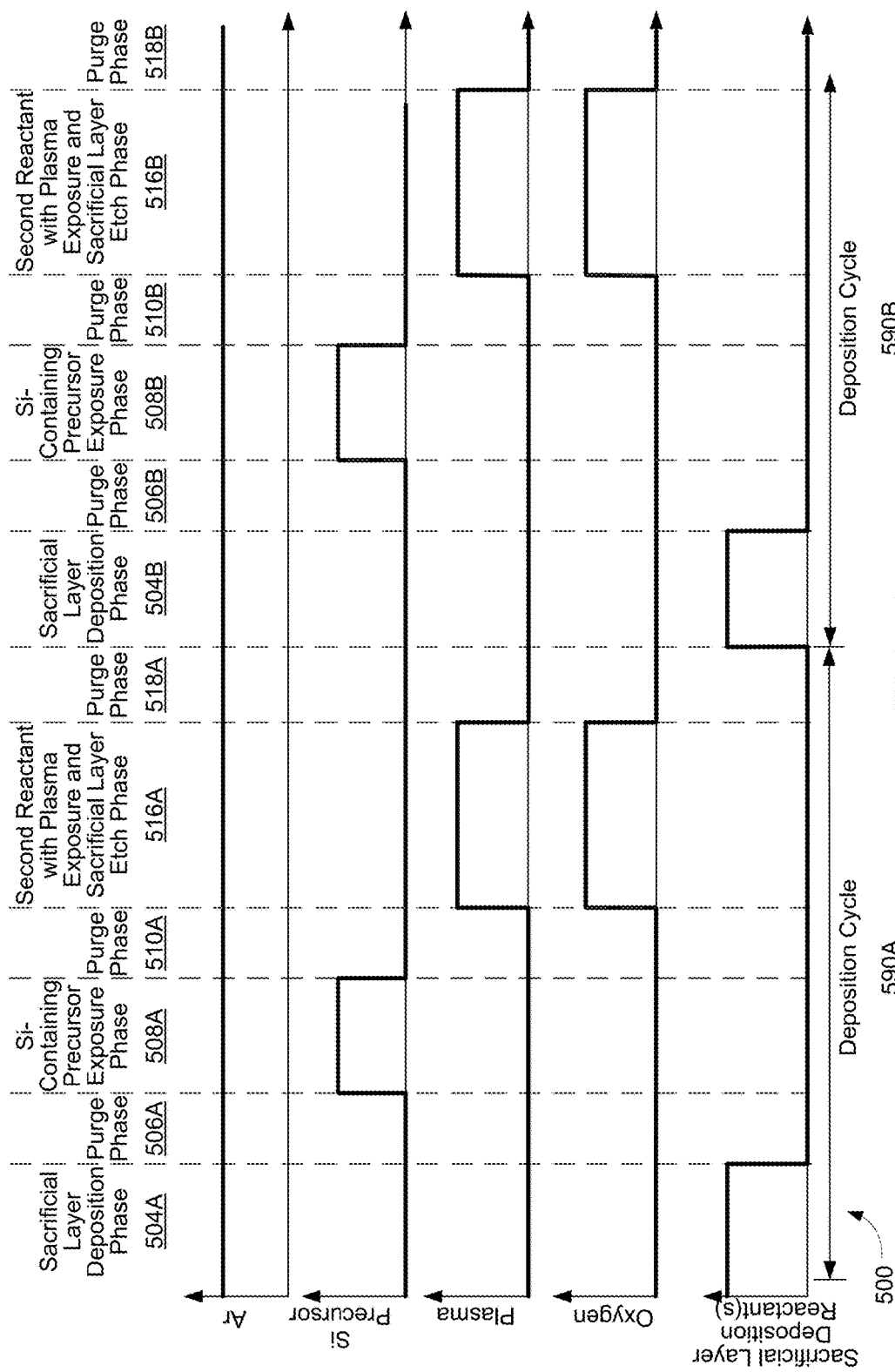
FIG. 5 is a timing sequence diagram showing an example of cycles in a method in accordance with certain disclosed embodiments.

FIG. 5 is a timing sequence diagram of example pulses in accordance with disclosed embodiments. FIG. 5 shows phases in an example ALD process 500, for various process parameters, such as carrier gas flow, first precursor flow, sacrificial layer deposition reactant(s) flow, plasma, and second reactant flow, where second reactant is used as both to etch the sacrificial layer and to convert an adsorbed precursor layer to form a film on a substrate. The lines indicate when the flow or plasma is turned on and off, accordingly. Example process parameters include, but are not limited to, flow rates for inert and reactant species, plasma power and frequency, substrate temperature, and process chamber pressure. The example provided in FIG. 5 is for depositing a silicon oxide film using a silicon-containing precursor and oxygen plasma, while using a carbon-containing sacrificial layer that can be etched when exposed to oxygen plasma. In this example, phases associated with operations 312 and 316 are combined such that the sacrificial layer is etched during the operation in which the adsorbed precursor layer reacts with the second reactant with plasma to form a film.

Two deposition cycles 590A and 590B are depicted. Each deposition cycle includes various phases. For example, deposition cycle 590A includes a sacrificial layer deposition phase 504, which may correspond to operation 304 of FIG. 3; a purge phase 506A (which may be optional and may correspond to operation 306 of FIG. 3); a silicon-containing precursor exposure phase 508A, which may correspond to operation 308 of FIG. 3; a purge phase 510A (which may be optional and may correspond to operation 310 of FIG. 3); a second reactant with plasma exposure and sacrificial layer etch phase 516A, which may correspond to combining operation 312 and 316 in FIG. 3; and purge phase 518A which may correspond to operation 318 of FIG. 3. As shown in example process 500, a carrier gas argon is flowed throughout the process. It will be understood that although argon is depicted in FIG. 5, any suitable carrier gas may be used as describe elsewhere herein. In various embodiments, the carrier gas is used as a purge gas. In some embodiments, the carrier gas may be different than the purge gas. In some embodiments, a carrier gas is only flowed during one or more of the purge phases (506A, 510A, 518A, 506B, 510B, and 518B). A carrier gas may be any of those described above with respect to operation 306 of FIG. 3.

In sacrificial layer deposition phase (504A for deposition cycle 590A and 504B for deposition cycle 590B for this example), sacrificial layer deposition reactant flows are turned on, and flow of silicon-containing precursor and oxygen are turned off. Although plasma is depicted as being off in this example, in some embodiments the plasma may be on to facilitate deposition of the sacrificial layer, such as where the sacrificial layer is deposited by PECVD. This phase may correspond to operation 304 of FIG. 3. In purge phase 306A, which may correspond to operation 306 of FIG. 3, a carrier gas flows while the gas flows and plasma are turned off. In silicon-containing precursor exposure phase 508A, which may correspond to operation 308 of FIG. 3, a silicon-containing precursor is flowed with a carrier gas and oxygen flow is turned off. The plasma is also turned off and flows for deposition reactants for depositing a sacrificial layer are also turned off. In purge phase 510A, all gas flows except the carrier gas are turned off and the plasma is turned off. This may correspond to operation 310 of FIG. 3. In second reactant with plasma exposure and sacrificial layer etch phase 516A, the carrier gas is flowed with the oxygen flow, while the plasma is turned on to ignite and generate and oxygen-containing plasma. This oxygen-containing plasma may be used to both etch the sacrificial layer and react with the adsorbed precursor to selectively form silicon oxide along sidewalls and the bottom of trenches while preventing deposition at or near the tops of the trench. This operation may correspond to combining operations 312 and 316 of FIG. 3. In purge phase 518A, the carrier gas flow remains on and all other gas flows and plasma is turned off.

In example process 500, it is determined in operation 320 of FIG. 3 that the film deposited is not an adequate thickness or the desired thickness, and that there is no sacrificial layer remaining on the substrate in operation 322 so the deposition cycle is repeated in deposition cycle 590B. In this example, the sacrificial layer is deposited yet again in sacrificial layer deposition phase 504B, but it will be understood that in some embodiments, repeated cycles of the process may not include operations for depositing a sacrificial layer in every cycle. Deposition cycle 590B as shown in FIG. 5 involves repeating the operations of FIG. 3, where operations 312 and 316 are combined. As shown, deposition cycle 590B includes sacrificial layer deposition phase 504B, purge phase 506B (which may be optional), silicon-containing exposure phase 508B, purge phase 510B (which may be optional), second reactant with plasma exposure and sacrificial layer etch phase 516B, and purge phase 518B (which may be optional).

Apparatus

Figure 6:
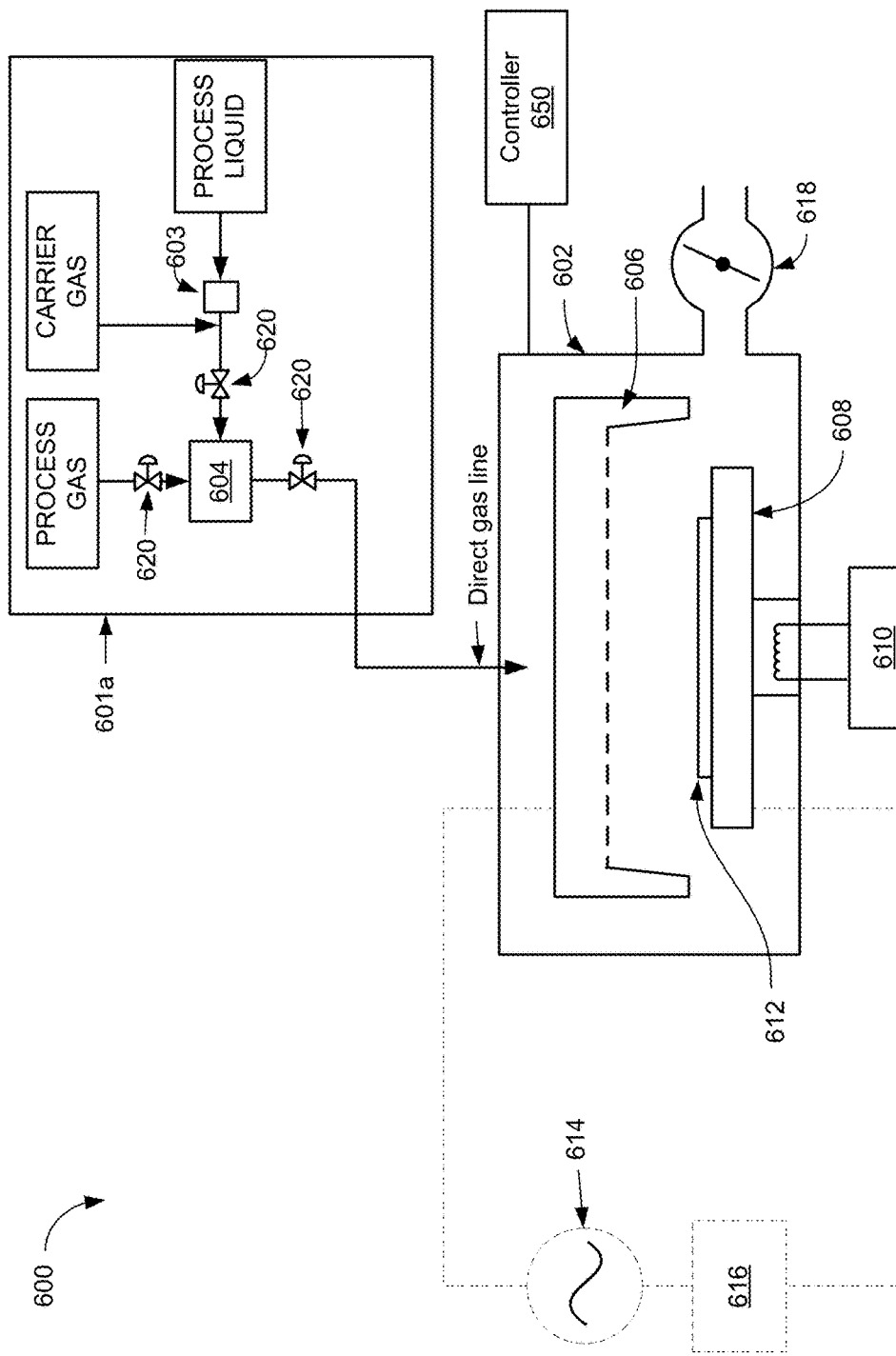
FIG. 6 is a schematic diagram of an example process chamber for performing certain disclosed embodiments.
Figure 7:
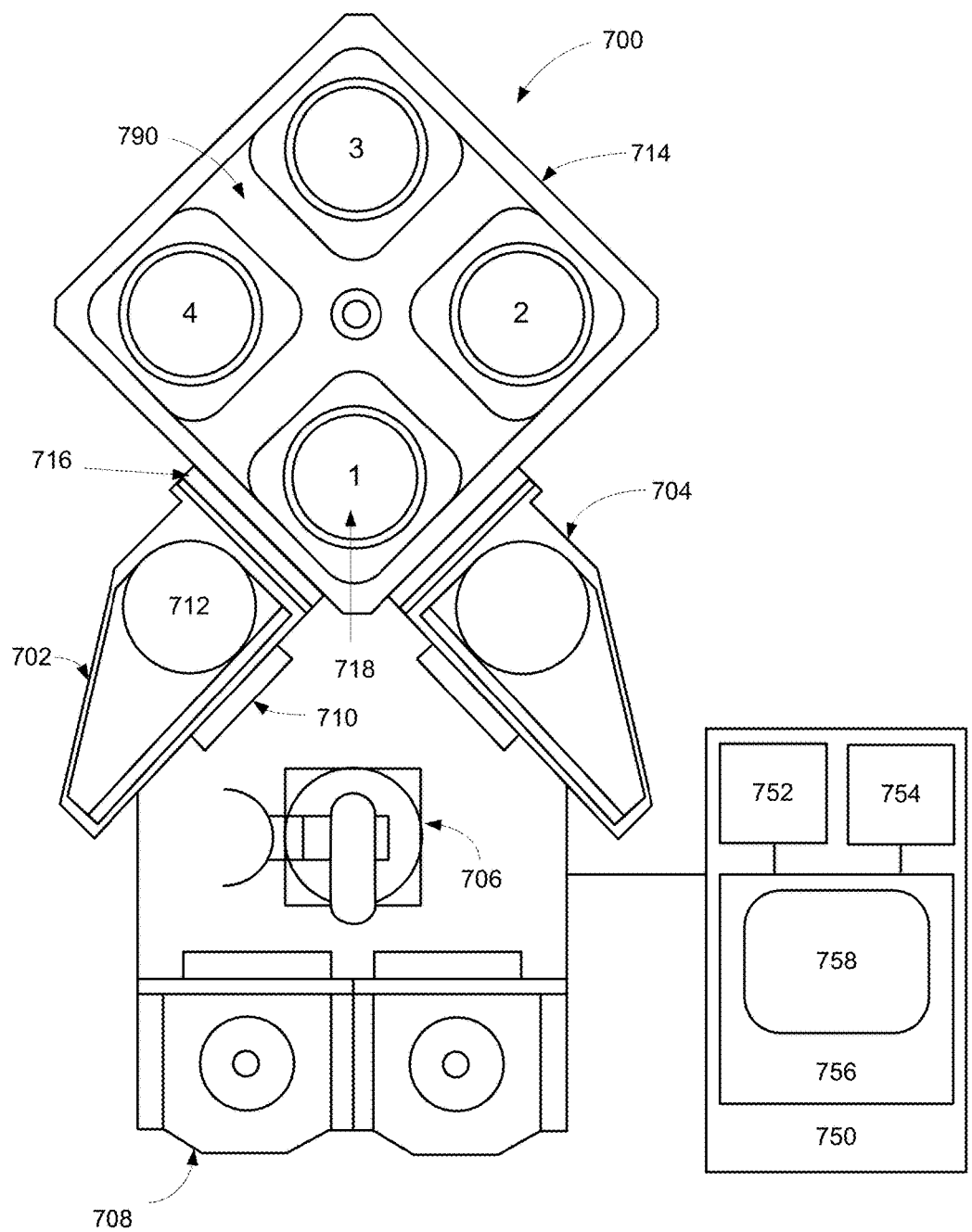
FIG. 7 is a schematic diagram of an example process tool for performing certain disclosed embodiments.

FIG. 6 depicts a schematic illustration of an embodiment of an atomic layer deposition (ALD) process station 600 having a process chamber body 602 for maintaining a low-pressure environment. A plurality of ALD process stations 600 may be included in a common low pressure process tool environment. For example, FIG. 7 depicts an embodiment of a multi-station processing tool 700. In some embodiments, one or more hardware parameters of ALD process station 600, including those discussed in detail below, may be adjusted programmatically by one or more computer controllers 650.

ALD process station 600 fluidly communicates with reactant delivery system 601a for delivering process gases to a distribution showerhead 606. Reactant delivery system 601a includes a mixing vessel 604 for blending and/or conditioning process gases, such as a silicon-containing gas, or oxygen-containing gas, for delivery to showerhead 606. One or more mixing vessel inlet valves 620 may control introduction of process gases to mixing vessel 604. The mixing vessel 604 may also be used for blending deposition reactants used for depositing a sacrificial layer. In some embodiments, the sacrificial layer may be deposited in the same chamber as the chamber used to deposit a film by ALD. For example, in some embodiments, the ALD process station 600 may be used to deposit a sacrificial layer by chemical vapor deposition (CVD) or plasma-enhanced chemical vapor deposition (PECVD) by programming the controller 650 to deliver process gases together instead of in separated alternating pulses. In some embodiments, the sacrificial layer is deposited in a process station separate from the ALD process station, such as in another station of the multi-station processing tool 700 as described with respect to FIG. 7 below. In some embodiments, the sacrificial layer is etched in a process station separate from the ALD process station, such as in another station of the multi-station processing tool 700 as further described below.

As an example, the embodiment of FIG. 6 includes a vaporization point 603 for vaporizing liquid reactant to be supplied to the mixing vessel 604. In some embodiments, vaporization point 603 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve purging and/or evacuating the delivery piping to remove residual reactant. However, purging the delivery piping may increase process station cycle time, degrading process station throughput. Thus, in some embodiments, delivery piping downstream of vaporization point 603 may be heat traced. In some examples, mixing vessel 604 may also be heat traced. In one non-limiting example, piping downstream of vaporization point 603 has an increasing temperature profile extending from approximately 100° C. to approximately 150° C. at mixing vessel 604.

In some embodiments, liquid precursor or liquid reactant may be vaporized at a liquid injector. For example, a liquid injector may inject pulses of a liquid reactant into a carrier gas stream upstream of the mixing vessel. In one embodiment, a liquid injector may vaporize the reactant by flashing the liquid from a higher pressure to a lower pressure. In another example, a liquid injector may atomize the liquid into dispersed microdroplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 603. In one scenario, a liquid injector may be mounted directly to mixing vessel 604. In another scenario, a liquid injector may be mounted directly to showerhead 606.

In some embodiments, a liquid flow controller (LFC) upstream of vaporization point 603 may be provided for controlling a mass flow of liquid for vaporization and delivery to process station 600. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, this may be performed by disabling a sense tube of the LFC and the PID controller.

Showerhead 606 distributes process gases toward substrate 612. In the embodiment shown in FIG. 6, the substrate 612 is located beneath showerhead 606 and is shown resting on a pedestal 608. Showerhead 606 may have any suitable shape, and may have any suitable number and arrangement of ports for distributing process gases to substrate 612.

In some embodiments, pedestal 608 may be raised or lowered to expose substrate 612 to a volume between the substrate 612 and the showerhead 606. It will be appreciated that, in some embodiments, pedestal height may be adjusted programmatically by a suitable computer controller 650.

In another scenario, adjusting a height of pedestal 608 may allow a plasma density to be varied during plasma activation cycles included in the process. At the conclusion of the process phase, pedestal 608 may be lowered during another substrate transfer phase to allow removal of substrate 612 from pedestal 608.

In some embodiments, a position of showerhead 606 may be adjusted relative to pedestal 608 to vary a volume between the substrate 612 and the showerhead 606. Further, it will be appreciated that a vertical position of pedestal 608 and/or showerhead 606 may be varied by any suitable mechanism within the scope of the present disclosure. In some embodiments, pedestal 608 may include a rotational axis for rotating an orientation of substrate 612. It will be appreciated that, in some embodiments, one or more of these example adjustments may be performed programmatically by one or more suitable computer controllers 650. The computer controller 650 may include any of the features described below with respect to controller 750 of FIG. 7.

In some embodiments where plasma may be used as discussed above, showerhead 606 and pedestal 608 electrically communicate with a radio frequency (RF) power supply 614 and matching network 616 for powering a plasma. In some embodiments, the plasma energy may be controlled by controlling one or more of a process station pressure, a gas concentration, an RF source power, an RF source frequency, and a plasma power pulse timing. For example, RF power supply 614 and matching network 616 may be operated at any suitable power to form a plasma having a desired composition of radical species. Examples of suitable powers are included above. Likewise, RF power supply 614 may provide RF power of any suitable frequency. In some embodiments, RF power supply 614 may be configured to control high- and low-frequency RF power sources independently of one another. Example low-frequency RF frequencies may include, but are not limited to, frequencies between 0 kHz and 500 kHz. Example high-frequency RF frequencies may include, but are not limited to, frequencies between 1.8 MHz and 2.45 GHz, or greater than about 13.56 MHz, or greater than 27 MHz, or greater than 40 MHz, or greater than 60 MHz. It will be appreciated that any suitable parameters may be modulated discretely or continuously to provide plasma energy for the surface reactions. The plasma conditions may be controlled and/or maintained such that plasma generated from the chemistry used to etch a sacrificial layer removes the sacrificial layer without removing adsorbed precursor on some sidewalls and at the bottom of features.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, instructions for a controller 650 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a first recipe phase may include instructions for setting a flow rate of a deposition gas for depositing a sacrificial layer, and instructions for modulating a flow rate of a carrier gas, and time delay instructions for the first recipe phase. A second recipe phase may include instructions for modulating or stopping a flow rate of a deposition gas for depositing a sacrificial layer, instructions for modulating the flow rate of a carrier or purge gas, and time delay instructions for the second recipe phase. A third recipe phase may include instructions for setting a flow rate of an inert and/or a reactant gas (e.g., the first precursor such as disilane), instructions for setting a flow rate of a carrier gas (such as argon), and time delay instructions for the third recipe phase. A fourth, subsequent recipe phase may include instructions for modulating or stopping a flow rate of an inert and/or a reactant gas, and instructions for modulating a flow rate of a carrier or purge gas and time delay instructions for the fourth recipe phase. A fifth recipe phase may include instructions for modulating a flow rate of a second reactant gas such as oxygen, instructions for modulating the flow rate of a carrier or purge gas, instructions for igniting a plasma, and time delay instructions for the fifth recipe phase. A sixth, subsequent recipe phase may include instructions for modulating or stopping a flow rate of an inert and/or a reactant gas, and instructions for modulating a flow rate of a carrier or purge gas and time delay instructions for the sixth recipe phase. It will be appreciated that these recipe phases may be further subdivided and/or iterated in any suitable way within the scope of the present disclosure.

In some embodiments, pedestal 608 may be temperature controlled via heater 610. Further, in some embodiments, pressure control for process station 600 may be provided by butterfly valve 618. As shown in the embodiment of FIG. 6, butterfly valve 618 throttles a vacuum provided by a downstream vacuum pump (not shown). However, in some embodiments, pressure control of process station 600 may also be adjusted by varying a flow rate of one or more gases introduced to the process station 600.

As described above, one or more process stations may be included in a multi-station processing tool. FIG. 7 shows a schematic view of an embodiment of a multi-station processing tool 700 with an inbound load lock 702 and an outbound load lock 704, either or both of which may include a remote plasma source. A robot 706, at atmospheric pressure, is configured to move wafers from a cassette loaded through a pod 708 into inbound load lock 702 via an atmospheric port 710. A wafer is placed by the robot 706 on a pedestal 712 in the inbound load lock 702, the atmospheric port 710 is closed, and the load lock is pumped down. Where the inbound load lock 702 includes a remote plasma source, the wafer may be exposed to a remote plasma treatment in the load lock prior to being introduced into a processing chamber 714. Further, the wafer also may be heated in the inbound load lock 702 as well, for example, to remove moisture and adsorbed gases. Next, a chamber transport port 716 to processing chamber 714 is opened, and another robot (not shown) places the wafer into the reactor on a pedestal of a first station shown in the reactor for processing. While the embodiment depicted in FIG. 7 includes load locks, it will be appreciated that, in some embodiments, direct entry of a wafer into a process station may be provided.

The depicted processing chamber 714 includes four process stations, numbered from 1 to 4 in the embodiment shown in FIG. 7. Each station has a heated pedestal (shown at 718 for station 1), and gas line inlets. It will be appreciated that in some embodiments, each process station may have different or multiple purposes. For example, in some embodiments, a process station may be switchable between an ALD and plasma-enhanced ALD process mode. In some embodiments, a sacrificial layer may be deposited in one process station and film deposition (e.g., silicon oxide deposition) may be performed in a second process station such that the substrate may be shuttled or moved between process stations for performing various disclosed embodiments. Additionally or alternatively, in some embodiments, processing chamber 714 may include one or more matched pairs of ALD and plasma-enhanced ALD process stations. While the depicted processing chamber 714 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 7 depicts an embodiment of a wafer handling system 790 for transferring wafers within processing chamber 714. In some embodiments, wafer handling system 790 may transfer wafers between various process stations and/or between a process station and a load lock. It will be appreciated that any suitable wafer handling system may be employed. Non-limiting examples include wafer carousels and wafer handling robots. FIG. 7 also depicts an embodiment of a system controller 750 employed to control process conditions and hardware states of process tool 700. System controller 750 may include one or more memory devices 756, one or more mass storage devices 754, and one or more processors 752. Processor 752 may include a CPU or computer, analog, and/or digital input/output connections, stepper motor controller boards, etc.

In some embodiments, system controller 750 controls all of the activities of process tool 700. System controller 750 executes system control software 758 stored in mass storage device 754, loaded into memory device 756, and executed on processor 752. Alternatively, the control logic may be hard coded in the controller 750. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 758 may include instructions for controlling the timing, mixture of gases, gas flow rates, chamber and/or station pressure, chamber and/or station temperature, wafer temperature, target power levels, RF power levels, substrate pedestal, chuck and/or susceptor position, and other parameters of a particular process performed by process tool 700. System control software 758 may be configured in any suitable way. For example, various process tool component subroutines or control objects may be written to control operation of the process tool components used to carry out various process tool processes. System control software 758 may be coded in any suitable computer readable programming language.

In some embodiments, system control software 758 may include input/output control (IOC) sequencing instructions for controlling the various parameters described above. Other computer software and/or programs stored on mass storage device 754 and/or memory device 756 associated with system controller 750 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 718 and to control the spacing between the substrate and other parts of process tool 700.

A process gas control program may include code for controlling gas composition (e.g., silicon-containing gases, oxygen-containing gases, gases for depositing a sacrificial layer, and purge gases as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 750. The user interface may include a display screen, graphical software displays of the apparatus and/or process conditions, and user input devices such as pointing devices, keyboards, touch screens, microphones, etc.

In some embodiments, parameters adjusted by system controller 750 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 750 from various process tool sensors. The signals for controlling the process may be output on the analog and digital output connections of process tool 700. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 750 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller 750 will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller 750.

In some implementations, the system controller 750 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 750, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 750 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 750 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 750, in some implementations, may be a part of or coupled to a computer that is integrated with, coupled to the system, otherwise networked to the system, or a combination thereof. For example, the system controller 750 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 750 receives instructions in the form of data, which specify parameters for each of the processing steps to be performed during one or more operations. It should be understood that the parameters may be specific to the type of process to be performed and the type of tool that the system controller 750 is configured to interface with or control. Thus as described above, the system controller 750 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the system controller 750 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

An appropriate apparatus for performing the methods disclosed herein is further discussed and described in U.S. patent application Ser. No. 13/084,399 (now U.S. Pat. No. 8,728,956), filed Apr. 11, 2011, and titled "PLASMA ACTIVATED CONFORMAL FILM DEPOSITION"; and Ser. No. 13/084,305, filed Apr. 11, 2011, and titled "SILICON NITRIDE FILMS AND METHODS," each of which is incorporated herein in its entireties.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

EXPERIMENTAL

Experiment 1

An experiment was conducted regarding etch rate of sacrificial layers. The first substrate including the sacrificial layer made of and ashable hard mask carbon film was exposed to cycles of alternating gas and plasma where plasma was on for three seconds in each cycle. The plasma power was set to 500 W. This experiment simulated a silicon oxide ALD deposition process where a silicon precursor and an oxidizing plasma are dosed in alternating pulses in cycles to deposit silicon oxide. However, for this first substrate, the silicon precursor was not flowed during the first dose of each cycle to simulate a lack of adsorption on the surface of the sacrificial layer. The etch rate was measured at 4.7 Å per cycle.

A second substrate including a sacrificial layer made of ashable hard mask carbon film was exposed to cycles of alternating silicon precursor gas and oxidizing plasma for plasma is on for three seconds in each cycle. The plasma power was also set to 500 W. This experiment simulates a silicon oxide ALD deposition process but for this substrate, the second precursor was flowed during the first dose of each cycle to simulate precursor being adsorbed onto the surface of the sacrificial layer. The etch rate was measured to be 0.7 Å per cycle. These results suggest that since the entry of the sacrificial layer scientifically decreased, the adsorbed precursor provide significant surface protection, and the sacrificial layer could be used to protect feature openings during an ALD process without being etched during the deposition.

Experiment 2

An experiment was conducted comparing sacrificial etch rate and deposition rate of oxide by ALD. A silicon substrate including a blanket ashable hard mask layer (sacrificial layer) was used. Five trials were performed at 50° C.—in each trial, the RF power and RF on time was increased to increase the etch rate of the ashable hard mask layer. The ALD oxide deposition rate was measured and the results are shown in Table 1.

TABLE 1

ALD Oxide Deposition Rate and Sacrificial Layer Etch Rate

| Sacrificial Layer Etch Rate (Å/cycle) | ALD Oxide Deposition Rate (Å/cycle) |
|---|---|
| 0 | 1.45 |
| 1.24 | 1.14 |
| 1.38 | 0.74 |
| 1.55 | 0.68 |
| 1.65 | 0.64 |

A greater than 50% reduction in ALD oxide deposition rate was observed for these processes at 50° C. These results suggest that ALD oxide deposition on sacrificial layer can be completely eliminated by increasing the etch rate of sacrificial layer. The etch rate of sacrificial layer can be increased by increasing temperature, and RF energy. Complete elimination of oxide growth on sacrificial layer gap fill applications can be achieved by increasing temperature to reduce the deposition rate of at the feature top will and ensure bottom up fill of features.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of processing a substrate comprising one or more features, each of the one or more features comprising a top and a bottom, the method comprising:
   (a) receiving the substrate having a sacrificial layer deposited over the one or more features, wherein a thickness of the sacrificial layer near the top of the one or more features is greater than the thickness of the sacrificial layer near the bottom of the one or more features, and wherein there is substantially no deposition of the sacrificial layer at the bottom of the one or more features;
   (b) exposing the substrate comprising the sacrificial layer to a precursor for a duration sufficient to adsorb the precursor on the one or more features; and
   (c) after exposing the substrate to the precursor, etching the sacrificial layer to remove adsorbed precursor from the top of the one or more features while leaving adsorbed precursor at the bottom of the one or more features.

2. The method of claim 1, further comprising (d) exposing the substrate to a second reactant reactive with the adsorbed precursor to preferentially deposit a film on sidewalls and the bottom of the one or more features.

3. The method of claim 2, wherein the substrate is exposed to the second reactant after etching the sacrificial layer.

4. The method of claim 2, wherein (d) further comprises igniting a plasma.

5. The method of claim 2, wherein the film is not silicon (Si) nor a silicon oxide (SiOx), and wherein (c) further comprises exposing the substrate to a fluorine-containing gas to etch the sacrificial layer.

6. The method of claim 2, wherein the film is selected from the group consisting of silicon oxides, boron doped silicon oxides, phosphorus doped silicon oxides, silicon, poly-silicon, silicon carbides, and silicon nitrides.

7. The method of claim 2, further comprising (e) depositing a second sacrificial layer over the one or more features, wherein the thickness of the second sacrificial layer near the top of the one or more features is greater than the thickness of the second sacrificial layer near the bottom of the one or more features, and wherein there is substantially no deposition of the second sacrificial layer at the bottom of the one or more features.

8. The method of claim 7, further comprising repeating (b)-(e) in cycles and performing (e) every n cycles, wherein n is an integer greater than or equal to 1.

9. The method of claim 8, wherein n is an integer greater than or equal to 2.

10. The method of claim 8, wherein n is 1 and wherein the second sacrificial layer is deposited to an average thickness of about 10 Å.

11. The method of claim 1, wherein less than about 50 nm of the sacrificial layer is etched in (c).

12. The method of claim 1, wherein the sacrificial layer comprises carbon and wherein (c) further comprises exposing the substrate to an oxidizing gas to etch the sacrificial layer.

13. The method of claim 1, wherein the sacrificial layer is deposited by exposing the substrate to a hydrocarbon precursor and igniting a plasma, the hydrocarbon precursor having the formula $C_XH_Y$, wherein X is an integer between 2 and 10, and Y is an integer between 2 and 24.

14. The method of claim 1, wherein the sacrificial layer comprises aluminum and wherein etching the sacrificial layer comprises exposing the substrate to a halogen-containing gas.

15. The method of claim 1, wherein the sacrificial layer comprises titanium and wherein etching the sacrificial layer comprises exposing the substrate to a halogen-containing gas.

16. The method of claim 1, wherein etching the sacrificial layer comprises exposing the substrate to chlorine.

17. The method of claim 1, wherein etching the sacrificial layer comprises igniting a plasma.

18. The method of claim 1, wherein the sacrificial layer is deposited using a method selected from the group consisting of chemical vapor deposition (CVD), plasma-enhanced chemical vapor deposition (PECVD), sputtering, physical vapor deposition (PVD), and spin coating.

19. The method of claim 1, wherein the thickness of the sacrificial layer near the top of the one or more features in (a) is less than about 1 nm.

20. The method of claim 1, wherein an aspect ratio of at least one of the one or more features is at least 2:1.

* * * * *